(12) United States Patent
Jin et al.

(10) Patent No.: US 8,513,709 B2
(45) Date of Patent: Aug. 20, 2013

(54) PHOTO DETECTING APPARATUS AND UNIT PIXEL THEREOF

(75) Inventors: Young Gu Jin, Hwaseong-si (KR); Kwan-Young Oh, Suwon-si (KR); Samuel Sungmok Lee, Seoul (KR); Kwang-Chol Choe, Seoul (KR); Se-Won Seo, Suwon-si (KR); Yoon-Dong Park, Yongin-si (KR); Eric Fossum, Yongin-si (KR); Kyoung-Lae Cho, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 323 days.

(21) Appl. No.: 12/844,381

(22) Filed: Jul. 27, 2010

(65) Prior Publication Data

US 2011/0019049 A1    Jan. 27, 2011

(30) Foreign Application Priority Data

Jul. 27, 2009  (KR) .................. 10-2009-0068243
Nov. 5, 2009   (KR) .................. 10-2009-0106662

(51) Int. Cl.
H01L 27/148 (2006.01)

(52) U.S. Cl.
USPC ....................................... 257/215

(58) Field of Classification Search
USPC ................ 257/215, 292, E27.132; 348/308, 348/E05.091
See application file for complete search history.

(56) References Cited

U.S. PATENT DOCUMENTS

| 6,350,979 | B1* | 2/2002 | Jing .................... 250/208.1 |
| 6,624,850 | B1 | 9/2003 | Guidash |
| 2002/0109164 | A1* | 8/2002 | Rhodes ................... 257/291 |
| 2003/0076484 | A1* | 4/2003 | Bamji et al. ............ 356/5.1 |
| 2007/0158770 | A1* | 7/2007 | Kawahito ................ 257/431 |
| 2009/0072120 | A1* | 3/2009 | McGarry et al. ...... 250/208.1 |
| 2009/0174799 | A1* | 7/2009 | Lee et al. ............... 348/294 |
| 2010/0141821 | A1* | 6/2010 | Fossum et al. ......... 348/308 |

FOREIGN PATENT DOCUMENTS

| JP | 2007-103591 | 4/2007 |
| KR | 1020060058584 | 5/2006 |

* cited by examiner

*Primary Examiner* — Thao Le
*Assistant Examiner* — Laura Dykes
(74) *Attorney, Agent, or Firm* — F. Chau & Associates, LLC

(57) ABSTRACT

A unit pixel of a photo detecting apparatus includes a photogate, a transfer gate and a floating diffusion region. The photogate includes a junction gate extending in a first direction and a plurality of finger gates extending from the junction gate in a second direction substantially perpendicular to the first direction. The transfer gate is formed adjacent to the junction gate. The floating diffusion region is formed adjacent to the first transfer gate.

24 Claims, 31 Drawing Sheets

PHOTO DETECTING APPARATUS AND UNIT PIXEL THEREOF

CROSS-REFERENCE TO RELATED APPLICATIONS

This application claims priority under 35 USC §119 to Korean Patent Application No. 2009-0068243, filed on Jul. 27, 2009, in the Korean Intellectual Property Office (KIPO), the contents of which are incorporated herein in its entirety by reference, and to Korean Patent Application No. 2009-0106662, filed on Nov. 5, 2009, in the Korean Intellectual Property Office (KIPO), the contents of which are incorporated herein in its entirety by reference.

BACKGROUND

1. Technical Field

The present disclosure relates to photo detecting apparatus, and, more particularly, to an apparatus for detecting image and/or depth information and a unit pixel thereof.

2. Discussion of the Related Art

A photo detecting apparatus converts optical signals about image or depth into electrical signals. The photo detecting apparatus has been researched to provide desired information more precisely and accurately. Recently, a three-dimensional depth image senor is being developed, which provides depth information (i.e., distance information) as well as image information.

The three-dimensional depth image senor is mainly based on a CMOS image sensor (CIS) that is manufactured using a CMOS process. Each pixel of the CIS includes a photo detecting region where charges corresponding to the intensity of incident light are generated and a floating diffusion region where the generated charges are accumulated.

In the conventional CIS, an image lag phenomenon may occur due to charges that are not transferred to the floating diffusion region and remain in the photo detecting region.

SUMMARY

In accordance with an exemplary embodiment of the inventive concept a unit pixel included in a photo detecting apparatus capable of improving efficiency of a charge transfer to a floating diffusion region is provided.

In accordance with an exemplary embodiment of the inventive concept a photo detecting apparatus capable of improving an image quality is also provided.

In accordance with an exemplary embodiment of the inventive concept a unit pixel of photo detecting apparatus includes a first photogate having a first junction gate extending in a first direction, and a plurality of first finger gates extending from the first junction gate in a second direction substantially perpendicular to the first direction. A first transfer gate is formed adjacent to the first junction gate. A first floating diffusion region is formed adjacent to the first transfer gate.

The first junction gate may provide a path through which charges collected under the first finger gates are transferred to the first floating diffusion region.

The unit pixel may further include at least one floating diffusion region formed adjacent to the first transfer gate.

The unit pixel of may further include a second photogate separated from the first photogate. The second photogate may include a second junction gate extending in the first direction, and a plurality of second finger gates extending from the second junction gate in the second direction, the first photogate and the second photogate disposed substantially symmetrically with each other. A second transfer gate may be formed adjacent to the second junction gate. A second floating diffusion region may be formed adjacent to the second transfer gate.

The unit pixel may further include a channel stop region formed between the first photogate and the second photogate.

The channel stop region may be configured to form a charge barrier between a region under the first photogate and a region under the second photogate.

The channel stop region may be configured to prevent charges collected under the first photogate from being transferred to a region under the second photogate, and to prevent charges collected under the second photogate from being transferred to a region under the first photogate.

The unit pixel may further include a bridging diffusion region formed between the first junction gate and the first transfer gate.

The bridging diffusion region may be configured to attract charges collected by the first photogate.

The first photogate may be formed of transparent conducting oxide.

The transparent conducting oxide may be selected from the group consisting of indium tin oxide, indium zinc oxide, zinc oxide, and titanium dioxide.

The first photogate may be formed over a semiconductor substrate. The semiconductor substrate may include an epitaxial layer having a doping density that gradually decreases in a direction toward a surface of the semiconductor substrate proximal to the first photogate.

The epitaxial layer may include a buried channel.

A first control signal may be applied to the first photogate, and the first control signal may periodically transition between a first logic level and a second logic level during an integration time.

Charges generated by incident light may be collected under the first photogate while the first control signal has the first logic level. The charges collected under the first photogate may be transferred to the first floating diffusion region while the first control signal has the second logic level.

A second control signal having a predetermined level may be applied to the first transfer gate, and the first transfer gate may be half turned on in response to the second control signal.

The first transfer gate may be configured to prevent charges collected under the first photogate from being transferred to the first floating diffusion region while the first control signal has the first logic level. The first transfer gate may be configured to transfer the charges collected under the first photogate to the first floating diffusion region while the first control signal has the second logic level.

In accordance with an exemplary embodiment of the inventive concept a unit pixel of a photo detecting device includes first and second photogates configured to turn on in response to first and second control signals, respectively, the first and second control signals having different phases. First and second charge collection regions are configured to collect charges generated by incident light while the first and second photogates are turned on, respectively. First and second bridging diffusion regions are formed adjacent to the first and second charge collection regions, respectively. First and second transfer gates are configured to turn on in response to a third control signal, the first and second transfer gates configured to generate first and second transfer channels, respectively. First and second floating diffusion regions are configured to accumulate the charges that are transferred from the first and second charge collection regions through the first and second bridging diffusion regions and the first and second transfer channels, respectively.

Each of the first and second photogates may include a junction gate extending in a first direction, and a plurality of finger gates extending from the junction gate in a second direction substantially perpendicular to the first direction. Each of the first and second photogates may include at least one spiral finger gate having a spiral shape.

The first and second control signals may have a phase difference of about 180 degrees.

In accordance with an exemplary embodiment of the inventive concept a unit pixel of a photo detecting device includes first and second photogates disposed substantially symmetrically with each other, each of the first and second photogates including at least one spiral finger gate having a spiral shape. First and second transfer gates are formed adjacent the first and second photogates, respectively. First and second floating diffusion regions are formed adjacent to the first and second transfer gates, respectively.

The spiral finger gate may include a first gate extending in a first direction and having a first length, and a second gate extending from an end of the first gate in a second direction substantially perpendicular to the first direction and having a second length shorter than the first length.

According to an exemplary embodiment of the inventive concept a photo detecting device includes a photoelectric converting unit including a plurality of unit pixels for converting incident light into electrical signals. Each of the unit pixels includes a photogate having a junction gate extending in a first direction and a plurality of finger gates extending from the junction gate in a second direction substantially perpendicular to the first direction, a transfer gate formed adjacent to the junction gate, and a floating diffusion region formed adjacent to the transfer gate. A signal processing unit is configured to generate data by processing the electrical signals.

The plurality of unit pixels may form a pixel array having rows and columns, and the signal processing unit may include a row driver connected with each row of the pixel array, a correlated double sampling unit connected with each column of the pixel array, and a timing controller that provides timing signals to control operational timing of the row driver and the correlated double sampling unit.

The photo detecting device may further include an analog-digital converting unit configured to convert the analog signals to digital signals. The correlated double sampling unit may be configured to perform analog double sampling to obtain a difference between reset components of a unit pixel and measured signal components of a unit pixel and output the analog signals to the analog-digital converting unit.

The signal processing unit may be configured to communicate with a processor over a bus and to allow the processor to receive and process the data.

The processor may interact with a memory, a storage device, an input/output device and a power supply connected to the bus.

According to an exemplary embodiment of the inventive concept unit pixel for photo detecting image and/or depth information, includes a semiconductor substrate. A first photogate is formed over the semiconductor substrate. At least one first photogate contact through which a first photogate control signal is applied, is formed on the first photogate. A first transfer gate is formed over the semiconductor substrate adjacent to the first photogate. A first transfer gate contact through which a first transfer gate control signal is applied, is formed on the first transfer gate. A first floating diffusion region is formed in the semiconductor substrate adjacent to the first transfer gate. A first floating diffusion region contact is formed on the first floating diffusion region to electrically connect the first floating diffusion region to a gate of a first drive transistor that amplifies a voltage of the first floating diffusion region. A second photogate is formed over the semiconductor substrate adjacent to the first photogate. At least one second photogate contact, through which a second photogate control signal is applied, is formed on the second photogate. A second transfer gate is formed over the semiconductor substrate adjacent to the second photogate. A second transfer gate contact, through which a second transfer gate control signal is applied, is formed on the second transfer gate.

A first buried channel may be formed in the semiconductor substrate under the first photogate and in a substrate region between the first photogate and the first transfer gate, and a second buried channel may be formed in the semiconductor substrate under the second photogate and in a substrate region between the second photogate and the second transfer gate.

The first buried channel and the second buried channel are doped with n-type impurities.

The unit pixel may further include a first p-type doped region formed in the semiconductor substrate between the first buried channel and the first photogate, and a second p-type doped region formed in the semiconductor substrate between the second buried channel and the second photogate.

The unit pixel may further include a first reset transistor formed over the semiconductor substrate and having a gate on which a reset transistor gate contact is formed and to which a reset signal is applied, a drain to which a reset supply voltage is coupled, and a source connected to the first diffusion region.

The unit pixel may further include a second reset transistor formed over the semiconductor substrate and having a gate on which a second reset transistor gate contact is formed and to which the reset signal is applied, a drain to which the reset supply voltage is coupled, and a source connected to the second diffusion region.

The unit pixel may further include an epitaxial layer on the semiconductor substrate proximal to the first photogate, the epitaxial layer doped with p-type impurities and having a doping density of the epitaxial layer that decreases in a direction to a surface of the semiconductor substrate proximal to the first photogate.

A buried channel lightly doped with n-type impurities may be formed in the epitaxial layer.

The unit pixel may further include a channel stop region formed in the semiconductor substrate between the first photogate and the second photogate.

The channel stop region may be heavily doped with p-type impurities.

The unit pixel may further include a first bridging diffusion region formed in the semiconductor substrate between the first photogate and the first transfer gate, and a second bridging diffusion region formed in the semiconductor substrate between the second photogate and the second transfer gate.

The unit pixel may further include a first buried channel doped with n-type impurities formed in the semiconductor substrate adjacent the first bridging diffusion region under the first photogate, a second buried channel doped with n-type impurities formed in the semiconductor substrate adjacent the second bridging diffusion region under the second photogate, a first p-type doped region formed in the semiconductor substrate between the first buried channel and the first photogate, and a second p-type doped region formed in the semiconductor substrate between the second buried channel and the second photogate.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
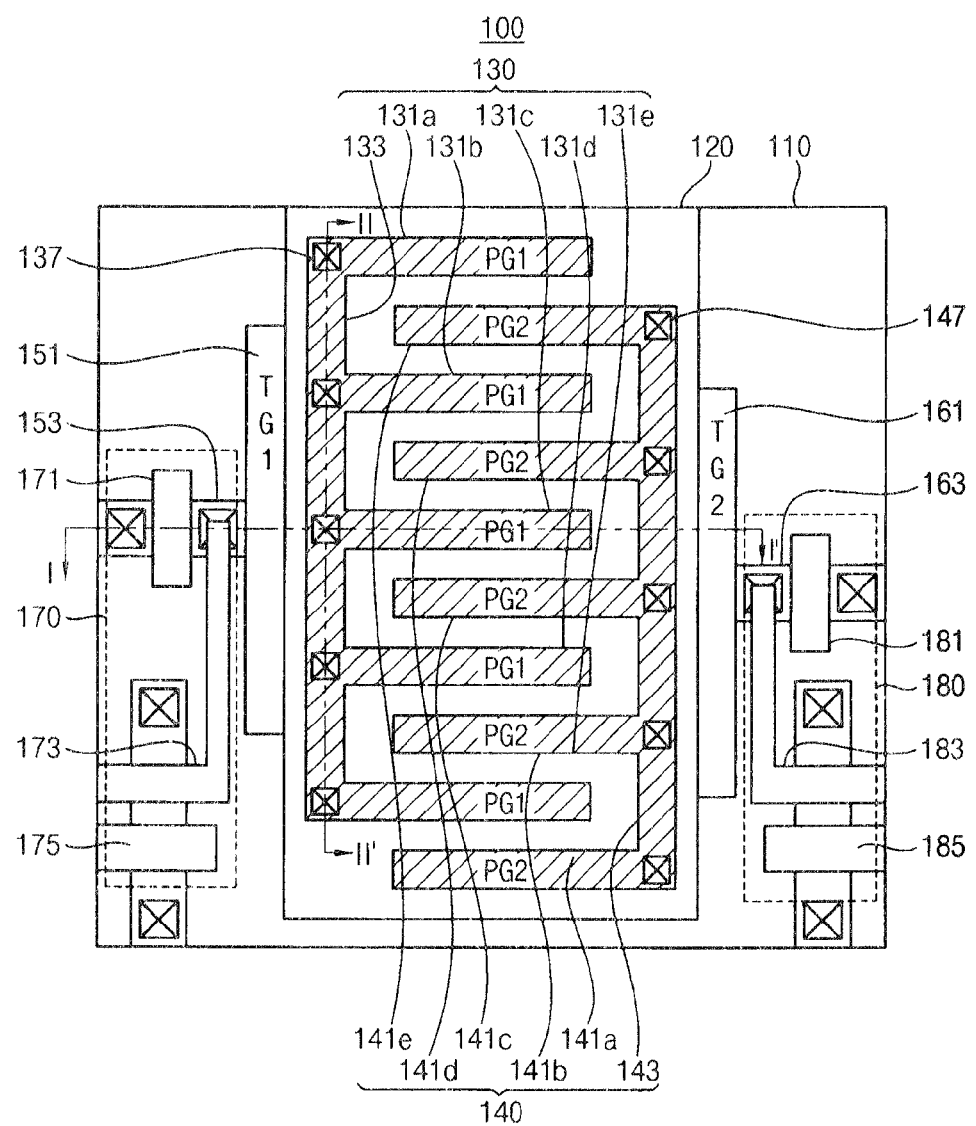
FIG. 1 is a plan view of a unit pixel included in a photo detecting apparatus according to an exemplary embodiment.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a plan view of a unit pixel included in a photo detecting apparatus according to an exemplary embodiment.

Referring to FIG. 1, a unit pixel 100 includes a first photogate 130, a second photogate 140, a first transfer gate 151, a second transfer gate 161, a first floating diffusion region 153, a second floating diffusion region 163, a first output unit 170, and a second output unit 180.

The first photogate 130 and the second photogate 140 are formed over a semiconductor substrate 110 such that the first photogate 130 and the second photogate 140 do not overlap each other. The first photogate 130 and the second photogate 140 may generate a charge collection region 120 for collecting charges generated in the semiconductor substrate 110.

The charge collection region 120 may collect electrons from electron-hole pairs generated by photons incident on the semiconductor substrate 110.

In an exemplary embodiment, the first photogate 130 and the second photogate 140 may be formed of polysilicon. In other embodiments, the first photogate 130 and the second photogate 140 may be formed of transparent conducting oxide (TCO), such as indium tin oxide (ITO), indium zinc oxide (IZO), zinc oxide (ZnO), titanium dioxide ($TiO_2$), etc.

The first photogate 130 includes a first junction gate 133 extending in a first direction and a plurality of first finger gates 131a, 131b, 131c, 131d, 131e extending from the first junction gate 133 in a second direction substantially perpendicular to the first direction. The first finger gates 131a, 131b, 131c, 131d, 131e may be parallel and separated from one another. In an exemplary embodiment, the first junction gate 133 and the first finger gates 131a, 131b, 131c, 131d, 131e may be formed at the same layer. In other embodiments, the first junction gate 133 and the first finger gates 131a, 131b, 131c, 131d, 131e may be formed at different layers and electrically connected through at least one contact 137.

The first junction gate 133 and the first finger gates 131a, 131b, 131c, 131d, 131e may generate a charge collection region under the gates 133, 131a, 131b, 131c, 131d, 131e to collect charges generated in the semiconductor substrate 110. The first junction gate 133 may provide a path through which charges collected under the respective first finger gates 131a, 131b, 131c, 131d, 131e are transferred. That is, the first junction gate 133 may gather the charges collected under the respective first finger gates 131a, 131b, 131c, 131d, 131e under the first junction gate 133. Accordingly, the first junction gate 133 may improve charge transfer efficiency of the charges collected under the respective first finger gates 131a, 131b, 131c, 131d, 131e.

The second photogate 140 includes a second junction gate 143 and a plurality of second finger gates 141a, 141b, 141c, 141d, 141e. The first photogate 130 and the second photogate 140 may have the same shape, and be disposed point-symmetrically without an overlapped region. The first finger gates 131a, 131b, 131c, 131d, 131e and the second finger gates 141a, 141b, 141c, 141d, 141e may be arranged in alternation with one another. That is, at least one of the second finger gates 141a, 141b, 141c, 141d, 141e may be located between two of the first finger gates 131a, 131b, 131c, 131d, 131e. Accordingly, data errors caused by imbalance or asymmetry between the first photogate 130 and the second photogate 140 may be reduced.

For example, each of the first and the second finger gates 131a, 131b, 131c, 131d, 131e, 141a, 141b, 141c, 141d, 141e may have a width ranging from about 0.25 μm to about 1 μm and a length ranging from about 3 μm to about 30 μm. An interval between adjacent two finger gates may be from about 0.25 μm to about 3 μm. Each of the first and the second junction gates 133, 143 may have a width of about 1 μm and a length ranging from about 3 μm to about 30 μm. The width, the length or the interval of the finger gate or the junction gate may be varied depending on a size of the unit pixel or a design rule. While each photogate illustrated in FIG. 1 includes five finger gates, the number of the finger gates included in the photogate may be varied depending on the size of the unit pixel or the design rule.

Contacts 137, 147 may be formed on the first photogate 130 and the second photogate 140. The first photogate 130 and the second photogate 140 may be controlled by signals applied through the contacts 137, 147. The first photogate 130 and the second photogate 140 may generate the charge collection region 120 in response to the signals applied through the contacts 137, 147.

The first transfer gate 151 and the second transfer gate 161 are formed over the semiconductor substrate 110. The first transfer gate 151 may be disposed between the first junction gate 133 and the first floating diffusion region 153, and the second transfer gate 161 may be disposed between the second junction gate 143 and the second floating diffusion region 163. The first transfer gate 151 and the second transfer gate 161 may transfer charges collected by the first photogate 130 and the second photogate 140 to the first transfer gate 151 and the second transfer gate 161, respectively.

The first finger gates 131a, 131b, 131c, 131d, 131e are coupled to the first junction gate 133, and the first transfer gate 151 is formed adjacent to the first junction gate 133. Thus, the first junction gate 133 and the first transfer gate 151 may provide a charge transfer path through which the charges collected under the first finger gates 131a, 131b, 131c, 131d, 131e are transferred to the first floating diffusion region 153. Similarly, the second junction gate 143 and the second transfer gate 161 may provide a charge transfer path through which the charges collected under the second finger gates 141a, 141b, 141c, 141d, 141e are transferred to the second floating diffusion region 163. Therefore, the unit pixel 100 according to an exemplary embodiment may include only one floating diffusion region per half-pixel. Since the unit pixel 100 according to an exemplary embodiment may include the reduced number of floating diffusion regions, fill factor may be improved and dark current and parasitic capacitance may be reduced.

The first floating diffusion region 153 and the second floating diffusion region 163 may accumulate the charges transferred by the first transfer gate 151 and the second transfer gate 161, respectively. The first output unit 170 and the second output unit 180 may output electrical signals corresponding to the charges accumulated in the first floating diffusion region 153 and the second floating diffusion region 163, respectively. In an exemplary embodiment, the first output unit 170 may include a first reset transistor 171 for discharging the charges accumulated in the first floating diffusion region 153, a first drive transistor 173 for amplifying a voltage of the first floating diffusion region 153, a first select transistor 175 for outputting the voltage amplified by the first drive transistor 173 to a first column line. The second output unit 180 may include a second reset transistor 181 for discharging the charges accumulated in the second floating diffusion region 163, a second drive transistor 183 for amplifying a voltage of the second floating diffusion region 163, a second select transistor 185 for outputting the voltage amplified by the second drive transistor 183 to a second column line.

As described above, since the finger gates extend from the junction gate and the transfer gate is formed adjacent to the junction gate, the unit pixel 100 according to an exemplary embodiment may include a single floating diffusion region per half-pixel, and improve the charge transfer efficiency.

Figure 2:
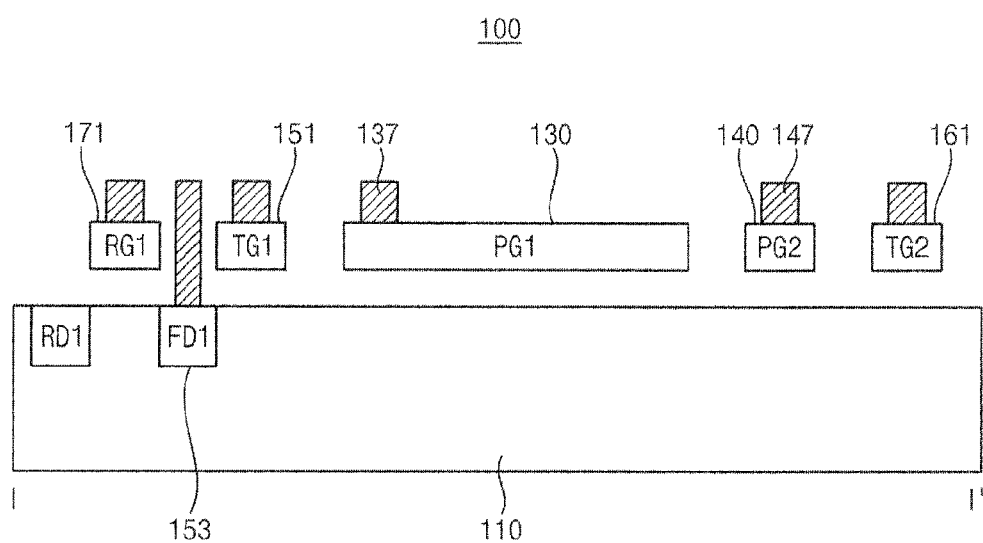
FIG. 2 is a cross-sectional view of an exemplary embodiment of the unit pixel taken along a line I-I' of FIG. 1.
Figure 3:
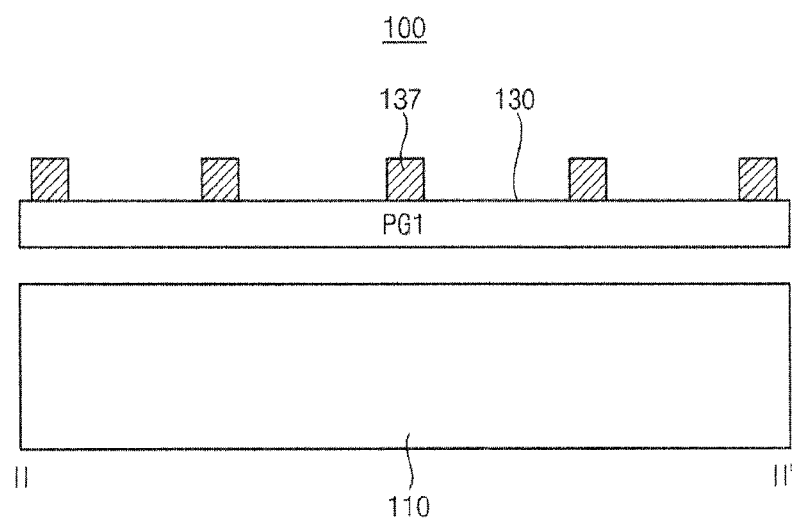
FIG. 3 is a cross-sectional view of an exemplary embodiment of the unit pixel taken along a line II-II' of FIG. 1.

FIG. 2 is a cross-sectional view of an exemplary embodiment of the unit pixel taken along a line I-I' of FIG. 1. FIG. 3 is a cross-sectional view of an exemplary embodiment of the unit pixel taken along a line II-II' of FIG. 1.

FIG. 2 illustrates a cross-sectional view of the unit pixel 100 taken along a length direction of a first finger gate 131c, and FIG. 3 illustrates a cross-sectional view of the unit pixel 100 taken along a length direction of a first junction gate 133.

Referring to FIGS. 2 and 3, a first photogate 130 is formed over a semiconductor substrate 110. At least one contact 137, through which a control signal is applied, may be formed on the first photogate 130. A first transfer gate 151 may be formed over the semiconductor substrate 110 adjacent to the first photogate 130. A contact, through which a control signal is applied, may be formed on the first transfer gate 151. A first floating diffusion region 153 may be formed in the semiconductor substrate 110 adjacent to the first transfer gate 151. A contact may be formed on the first floating diffusion region 153 to electrically connect the first floating diffusion region 153 to a gate of a first drive transistor 173 illustrated in FIG. 1. A first reset transistor 171 may include a gate RG1 on which a contact is formed, where a reset signal is applied. The first reset transistor 171 may further include a drain to which a reset supply voltage is coupled, and a source 153.

A second photogate 140 is formed over the semiconductor substrate 110. At least one contact 147, through which a control signal is applied, may be formed on the second photogate 140. A second transfer gate 161 may be formed over the semiconductor substrate 110 adjacent to the second photogate 140. A contact, through which a control signal is applied, may be formed on the second transfer gate 161.

Figure 4:
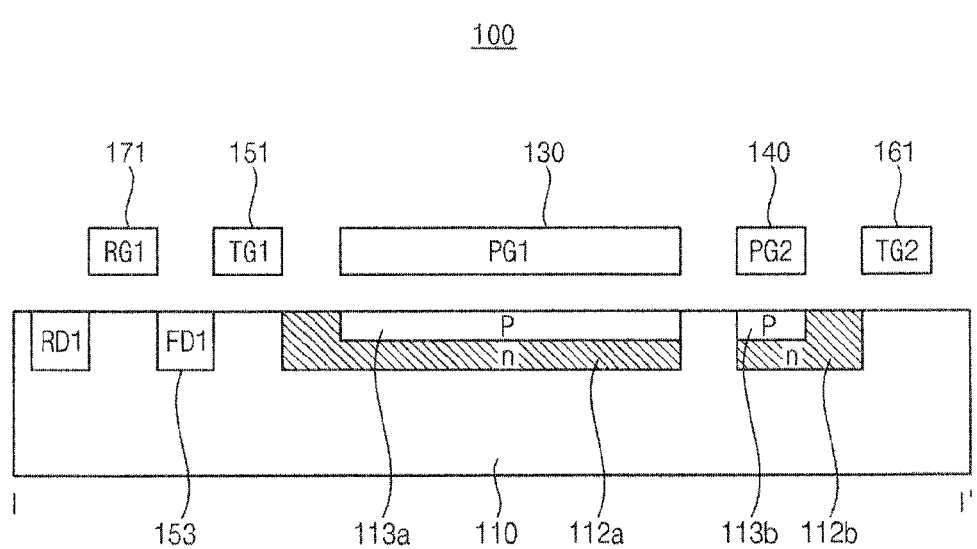
FIG. 4 is a cross-sectional view of an exemplary embodiment of the unit pixel taken along a line I-I' of FIG. 1.

FIG. 4 is a cross-sectional view of an exemplary embodiment of the unit pixel taken along a line I-I' of FIG. 1.

FIG. 4 illustrates a cross-sectional view of the unit pixel 100 taken along a length direction of a first finger gate 131c.

Referring to FIG. 4, the unit pixel 100 further includes a first buried channel 112a and a second buried channel 112b formed in the semiconductor substrate 110. The first buried channel 112a and the second buried channel 112b may be formed near a surface of the semiconductor substrate 110 where the first photogate 130 and the second photogate 140 are overlain. The first buried channel 112a and the second buried channel 112b may be doped with n-type impurities. The first buried channel 112a may be formed in a substrate region under the first photogate 130 and in a substrate region between the first photogate 130 and the first transfer gate 151, and the second buried channel 112b may be formed in a substrate region under the second photogate 140 and in a substrate region between the second photogate 140 and the second transfer gate 161.

The unit pixel 100 may further include a first p-type doped region 113a formed in the semiconductor substrate 110 between the first buried channel 112a and the first photogate 130, and a second p-type doped region 113b formed in the semiconductor substrate 110 between the second buried channel 112b and the second photogate 140.

Figure 5:
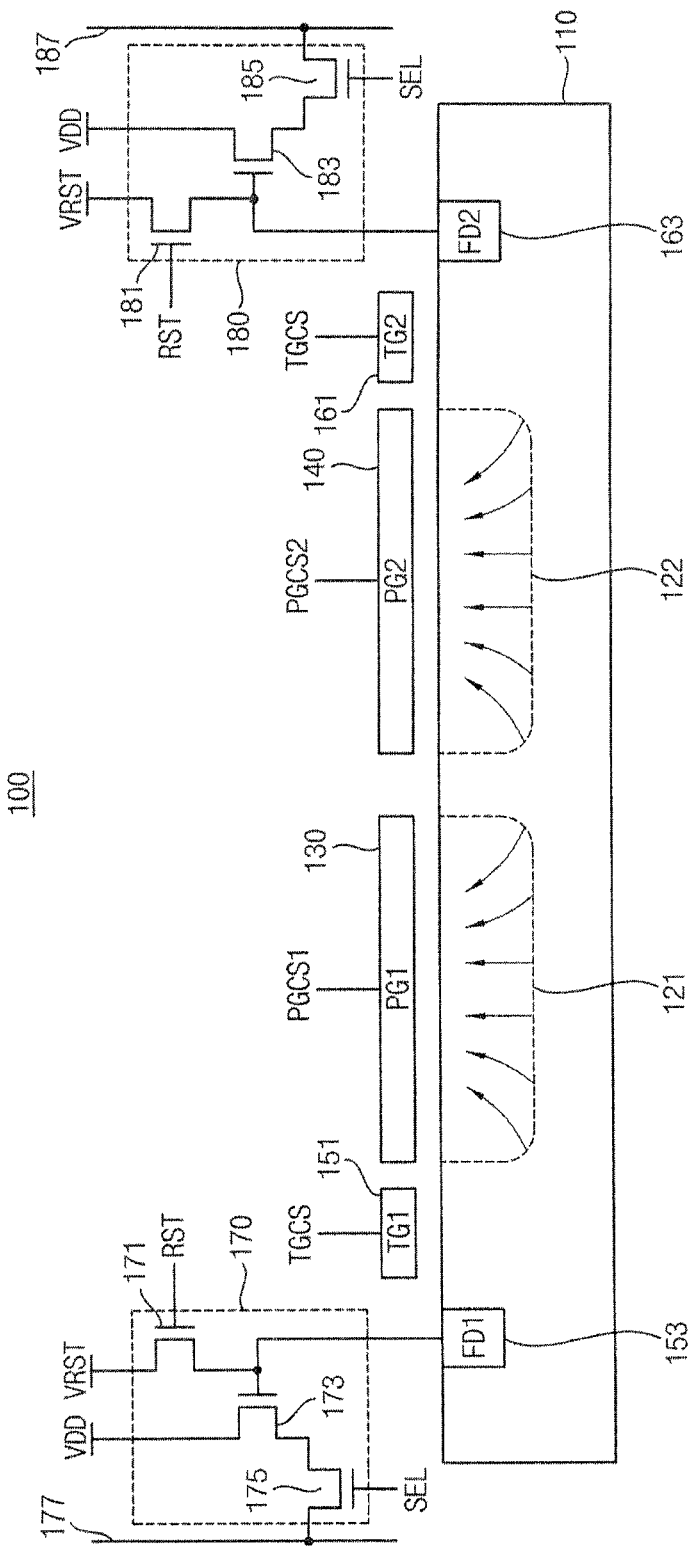
FIG. 5 is a schematic cross-sectional view for illustrating operations of the unit pixel of FIG. 1.

FIG. 5 is a schematic cross-sectional view for illustrating operations of the unit pixel of FIG. 1.

Referring to FIG. 5, a unit pixel 100 includes a first photogate 130, a second photogate 140, a first transfer gate 151, a second transfer gate 161, a first floating diffusion region 153, a second floating diffusion region 163, a first output unit 170, and a second output unit 180.

The first photogate 130 and the second photogate 140 may receive a first control signal PGCS1 and a second control signal PGCS2, respectively. The first control signal PGCS1 and the second control signal PGCS2 may periodically transition between a first logic level and a second logic level during an integration time. For example, the first control signal PGCS1 and the second control signal PGCS2 may be periodic voltages, such as pulse train voltages, sine voltages, cosine voltage, etc.

A first charge collection region 121 under the first photogate 130 may collect charges generated in a semiconductor substrate 110 while the first control signal PGCS1 has the first logic level. A second charge collection region 122 under the second photogate 140 may collect charges generated in the semiconductor substrate 110 while the second control signal PGCS2 has the first logic level.

During the integration time, the first control signal PGCS1 and the second control signal PGCS2 may have different phases. For example, the first control signal PGCS1 and the second control signal PGCS2 may have a phase difference of about 180 degrees. When the first control signal PGCS1 has the first logic level, the second control signal PGCS2 may have the second logic level. When the first control signal PGCS1 has the second logic level, the second control signal PGCS2 may have the first logic level. Accordingly, either the first photogate 130 or the second photogate 140 may be selectively turned on, and either the first charge collection region 121 or the second charge collection region 122 may selectively collect the charges.

A photo detecting apparatus including the unit pixel 100 may detect depth information by using the selectively turned-on photogates 130, 140. The photo detecting apparatus may further include a light emitting device, such as a light emitting diode (LED), a laser diode, or the like, which emits light having a predetermined wavelength. The photo detecting apparatus may periodically turn on the light emitting device to transmit the light such that the intensity of the transmitted light may periodically change. The transmitted light may be reflected by an object, and the photo detecting apparatus may receive the reflected light. The received light may be delayed by a time of flight (TOF) of the light (i.e., a time from when the light is transmitted to when the light is received) with respect to the transmitted light. The photo detecting apparatus may detect the distance to the object by measuring the TOF.

The photo detecting apparatus may measure the delay time of the received light with respect to the transmitted light (i.e., the TOF) based on a ratio of charges collected in the first charge collection region 121 to charges collected in the second charge collection region 122. For example, the first control signal PGCS1 and the intensity of the transmitted light may the same phase, and the second control signal PGCS2 and the intensity of the transmitted light may have a phase difference of about 180 degrees. In this case, as the TOF increases, the first charge collection region 121 may collect the decreased number of charges, and the second charge collection region 122 may collect the increased number of charges. That is, the longer the TOF is, the lower the ratio is. Thus, the photo detecting apparatus may obtain the TOF from the ratio of the charges collected in the first charge collection region 121 to the charges collected in the second charge collection region 122.

The photo detecting apparatus may calculate the distance from the photo detecting apparatus to the object by using an equation expressed as D=TOF*c/2, where D represents the distance from the photo detecting apparatus to the object, c represents speed of light, and TOF represents the time of flight of the light.

The first transfer gate 151 and the second transfer gate 161 may receive a third control signal TGCS having a predetermined voltage level. The third control signal TGCS may be commonly applied to the first transfer gate 151 and the second transfer gate 161. The first transfer gate 151 may generate a first transfer channel between the first charge collection region 121 and the first floating diffusion region 153 in response to the third control signal TGCS, and the second transfer gate 161 may generate a second transfer channel between the second charge collection region 122 and the second floating diffusion region 163 in response to the third control signal TGCS.

The first floating diffusion region 153 and the second floating diffusion region 163 may be formed in the semiconductor substrate 110. The first floating diffusion region 153 and the second floating diffusion region 163 may be heavily doped with n-type impurities. The first floating diffusion region 153 may accumulate the charges that are collected in the first charge collection region 121 and transferred through the first transfer channel under the first transfer gate 151. The second floating diffusion region 163 may accumulate the charges that are collected in the second charge collection region 122 and transferred through the second transfer channel under the second transfer gate 152.

The first output unit 170 and the second output unit 180 may output electrical signals corresponding to the charges accumulated in the first floating diffusion region 153 and the second floating diffusion region 163 to a first column line 177 and a second column line 187, respectively. The first output unit 170 may include a first reset transistor 171, a first drive transistor 173 and a first select transistor 175, and the second output unit 180 may include a second reset transistor 181, a second drive transistor 183 and a second select transistor 185.

The first reset transistor 171 may discharge the charges accumulated in the first floating diffusion region 153 in response to a reset signal RST, and the second reset transistor 181 may discharge the charges accumulated in the second floating diffusion region 163 in response to the reset signal RST. The first reset transistor 171 may have a gate terminal to which the reset signal is applied, a first terminal coupled to a reset supply voltage VRST, and a second terminal coupled to the first floating diffusion region 153, and second reset transistor 181 may have a gate terminal to which the reset signal is applied, a first terminal coupled to the reset supply voltage VRST, and a second terminal coupled to the second floating diffusion region 163.

The first drive transistor 173 may amplify a voltage of the first floating diffusion region 153, and the second drive transistor 183 may amplify a voltage of the second floating diffusion region 163. The first drive transistor 173 may have a gate terminal coupled to the first floating diffusion region 153, a first terminal coupled to a power supply voltage VDD, and a second terminal coupled to the first select transistor 175, and the second drive transistor 183 may have a gate terminal coupled to the second floating diffusion region 163, a first terminal coupled to the power supply voltage VDD, and a second terminal coupled to the second select transistor 185.

The first select transistor 175 may output the voltage amplified by the first drive transistor 173 to the first column line 177, and the second select transistor 185 may output the voltage amplified by the second drive transistor 183 to the second column line 187. The first select transistor 175 may have a gate terminal to which a select signal SEL is applied, a first terminal coupled to the second terminal of the first drive transistor 173, and a second terminal coupled to the first column line 177, and the second select transistor 185 may have a gate terminal to which the select signal SEL is applied, a first terminal coupled to the second terminal of the second drive transistor 183, and a second terminal coupled to the second column line 187.

While each of half-pixels of the unit pixel 100 illustrated in FIG. 5 includes one output unit, a portion or all of the output unit may be shared by a plurality of half-pixels.

Figure 6:
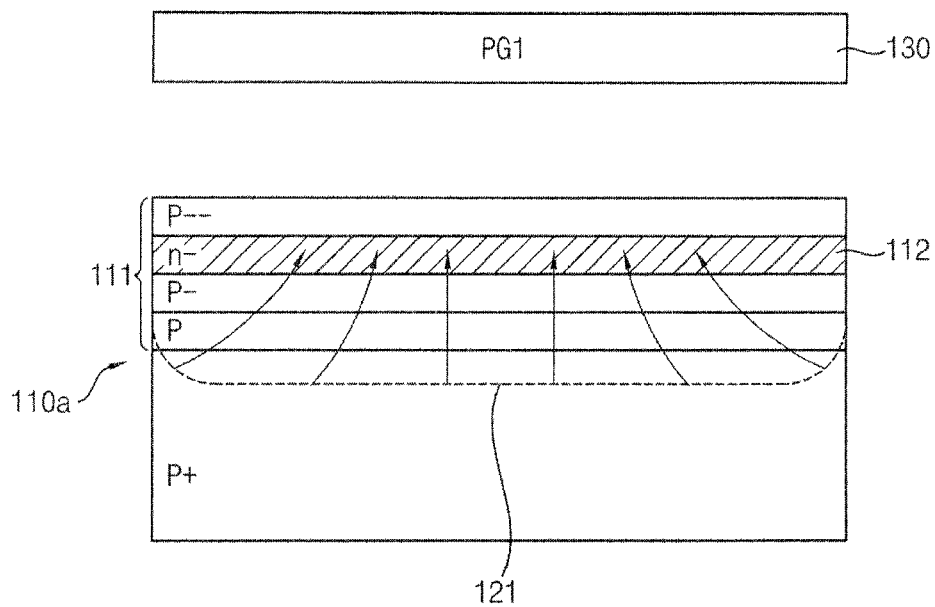
FIG. 6 is a diagram illustrating an exemplary embodiment of a semiconductor substrate illustrated in FIG. 1.

FIG. 6 is a diagram illustrating an exemplary embodiment of a semiconductor substrate illustrated in FIG. 1.

Referring to FIG. 6, a semiconductor substrate 110a includes an epitaxial layer 111 formed on a bulk substrate. The epitaxial layer 111 may be doped with p-type impurities such that doping density of the epitaxial layer 111 may gradually decrease in a direction to a surface where a photogate 130 is overlain. The epitaxial layer 111 may increase the vertical movement speed of charges generated at the semiconductor substrate 110a to a channel (e.g., a surface channel or a buried channel) of a charge collection region 121.

The semiconductor substrate 110a may further include a buried channel 112 formed in the epitaxial layer 111. The buried channel 112 may be lightly doped with n-type impurities. The buried channel 112 may increase the horizontal movement speed of the charges collected in the charge collection region 121 to a transfer channel under a transfer gate.

The epitaxial layer 111 and the buried channel 112 included in the semiconductor substrate 110a may improve charge collection efficiency and charge transfer efficiency.

Figure 7:
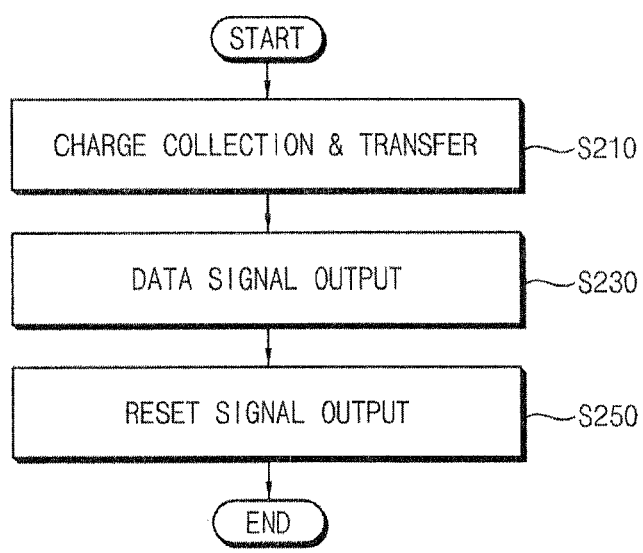
FIG. 7 is a flow chart illustrating a method of operating a unit pixel included in a photo detecting apparatus according to an exemplary embodiment.

FIG. 7 is a flow chart illustrating a method of operating a unit pixel included in a photo detecting apparatus according to an exemplary embodiment.

Referring to FIGS. 5 and 7, during an integration time, charges generated in a semiconductor substrate 110 are collected in a first charge collection region 121 and a second charge collection region 122, and the collected charges are transferred to a first floating diffusion region 153 and a second diffusion region 163 (step S210). In an exemplary embodiment, the first floating diffusion region 153 and the second diffusion region 163 may be reset by a first reset transistor 171 and a second reset transistor 181 before the first charge collection region 121 and the second charge collection region 122 collect the charges.

A first photogate 130 and a second photogate 140 may be controlled by a first control signal PGCS1 and a second control signal PGCS2 applied thereto. The first control signal PGCS1 and the second control signal PGCS2 may be periodic signals transitioning between a first logic level and a second logic level during the integration time. The first control signal PGCS1 and the second control signal PGCS2 may have a phase difference of about 180 degrees. Accordingly, either the first photogate 130 or the second photogate 140 may be selectively turned on.

While the first control signal PGCS1 has the first logic level (e.g., logic high level) and the second control signal PGCS2 has the second logic level (e.g., logic low level), the first photogate 130 is turned on and the second photogate 140 is turned off. If the first photogate 130 is turned on, the first charge collection region 121 collects the charges generated in the semiconductor substrate 110. If the second photogate 140 is turned off, the charges collected in the second charge collection region 122 are transferred to the second diffusion region 163.

While the first control signal PGCS1 has the second logic level and the second control signal PGCS2 has the first logic level, the first photogate 130 is turned off and the second photogate 140 is turned on. If the first photogate 130 is turned off, the charges collected in the first charge collection region 121 are transferred to the first diffusion region 153. If the second photogate 140 is turned off, the second charge collection region 122 collects the charges generated in the semiconductor substrate 110.

As described above, each half-pixel may periodically repeat the charge collection operation and the charge transfer operation during the integration time.

After the integration time, a first output unit 170 outputs a first data voltage corresponding to the charges accumulated in the first floating diffusion region 153 to a first column line 177, and a second output unit 180 outputs a second data voltage corresponding to the charges accumulated in the second floating diffusion region 163 to a second column line 187 (step S230).

A first drive transistor 173 may generate the first data voltage by amplifying a voltage corresponding to the charges accumulated in the first floating diffusion region 153, and a first select transistor 175 may output the first data voltage to the first column line 177 in response to a select signal SEL. A second drive transistor 183 may generate the second data voltage by amplifying a voltage corresponding to the charges accumulated in the second floating diffusion region 163, and a second select transistor 185 may output the second data voltage to the second column line 187 in response to the select signal SEL.

After outputting the first data voltage and the second data voltage, the first output unit 170 outputs a first reset voltage to the first column line 177, and the second output unit 180 outputs a second reset voltage to the second column line 187 (step S250).

A first reset transistor 171 may reset the first floating diffusion region 153 in response to a reset signal RST, and a second reset transistor 181 may reset the second floating diffusion region 163 in response to the reset signal RST. For example, the first reset transistor 171 and the second reset transistor 181 may be turned on in response to the reset signal RST, and the first reset transistor 171 and the second reset transistor 181 may discharge the charges accumulated in the first floating diffusion region 153 and the second floating diffusion region 163 by coupling the first floating diffusion region 153 and the second floating diffusion region 163 to a reset supply voltage VRST.

The first drive transistor 173 may generate the first reset voltage by amplifying a voltage of the reset first floating diffusion region 153, and the first select transistor 175 may output the first reset voltage to the first column line 177 in response to the select signal SEL. The second drive transistor 183 may generate the second reset voltage by amplifying a voltage of the reset second floating diffusion region 163, and the second select transistor 185 may output the second reset voltage to the second column line 187 in response to the select signal SEL.

A photo detecting apparatus operated by the method according to an exemplary embodiment may generate image and/or depth information by performing correlated double sampling based on a voltage difference between a data voltage and a reset voltage, thereby reducing a noise and improving the quality of the image and/or the depth information.

Figure 8:
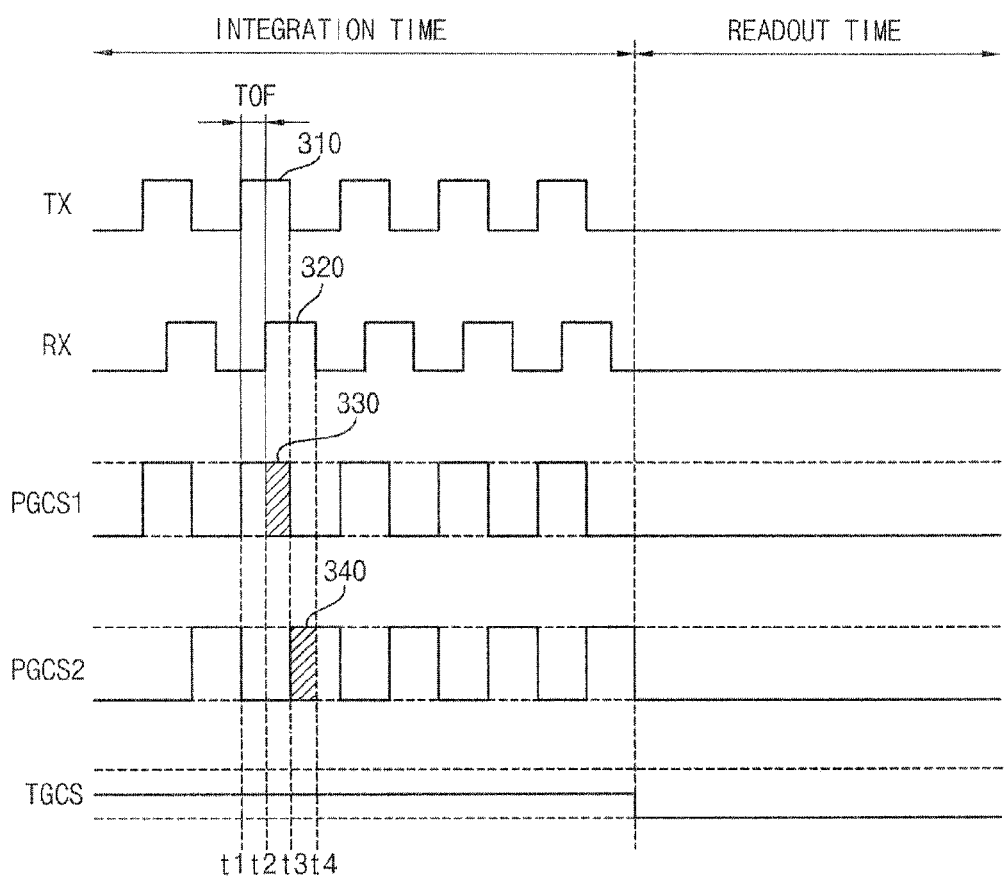
FIG. 8 is a timing diagram illustrating intensity of transmitted light, intensity of received light and control signals in a unit pixel operated by the method of FIG. 7.

FIG. 8 is a timing diagram illustrating intensity of transmitted light, intensity of received light and control signals in a unit pixel operated by the method of FIG. 7.

Referring to FIGS. 5 and 8, during an integration time, a photo detecting apparatus including a unit pixel 100 may transmit light TX having periodically varying intensity. For example, the photo detecting apparatus may repeat the transmission and non-transmission of the light TX by turning on or off a light emitting device at a frequency ranging from about 10 MHz to about 100 MHz.

The transmitted light TX may be reflected by an object, and reach the photo detecting apparatus as a received light RX. The received light RX may be delayed by a TOF with respect to the transmitted light TX. For example, the photo detecting apparatus may receive photons 320 that are delayed by the TOF (e.g., t2-t1 or t4-t3) with respect to transmitted photons 310.

During the integration time, the first control signal PGCS1 may have the same phase as the intensity of the transmitted light TX, and the second control signal PGCS2 may have a phase difference of about 180 degrees with respect to the intensity of the transmitted light TX. A portion 330 of charges generated by the received photons 320 may be collected by a first charge collection region 121 while the first control signal PGCS1 has a first logic level, and another portion 340 of the charges generated by the received photons 320 may be collected by a second charge collection region 122 while the second control signal PGCS2 has the first logic level. For example, the first logic level of the first control signal PGCS1 and the second control signal PGCS2 may be about 3 V, and a second logic level of the first control signal PGCS1 and the second control signal PGCS2 may be about 0 V.

A ratio of charges collected in the first charge collection region 121 to charges collected in the second charge collection region 122 may depend on the TOF. For example, as the TOF increases, the first charge collection region 121 may collect the decreased number of charges, and the second charge collection region 122 may collect the increased number of charges. Thus, the photo detecting apparatus may obtain a delay time of the received light RX with respect to the transmitted light TX, or the TOF from the ratio of the charges collected in the first charge collection region 121 to the charges collected in the second charge collection region 122.

The photo detecting apparatus may calculate the distance from the photo detecting apparatus to the object by using an equation expressed as $D=TOF*c/2$, where D represents the distance from the photo detecting apparatus to the object, c represents speed of light, and TOF represents the time of flight of the light. Accordingly, the photo detecting apparatus may detect distance information about the object.

Further, the photo detecting apparatus may detect image information based on data from a first half-pixel including a first photogate 130 and data from a second half-pixel including a second photogate 140. For example, the photo detecting apparatus generate the image information by adding the data from the first half-pixel to the data from the second half-pixel.

During the integration time, a third control signal TGCS may have a predetermined voltage level between a logic high level and a logic low level. For example, the logic high level of the third control signal TGCS may be about 2 V, the logic low level of the third control signal TGCS may be about 0 V, and the predetermined voltage level of the third control signal TGCS may be from about 0.5 V to about 1 V. If the third control signal TGCS having the predetermined voltage level is applied to a first transfer gate 151 and a second transfer gate 152, the first transfer gate 151 and the second transfer gate 152 may neither be fully turned on nor be fully turned off, which may be half turned on.

If the first transfer gate 151 and the second transfer gate 152 are half turned on, substrate regions under the first transfer gate 151 and the second transfer gate 152 may form potential barriers with respect to substrate regions under photogates being turned on, and provide transfer channels to substrate regions under photogates being turned off. Thus, the first charge collection region 121 may perform a charge collection operation while the first control signal PGCS1 has the first logic level, and the charges collected in the first charge collection region 121 may be transferred to a first floating diffusion region 153 while the first control signal PGCS1 has the second logic level. Similarly, the second charge collection region 122 may perform the charge collection operation while the second control signal PGCS2 has the first logic level, and the charges collected in the second charge collection region 122 may be transferred to a second floating diffusion region 163 while the second control signal PGCS2 has the second logic level.

During a readout time, the first control signal PGCS1 and the second control signal PGCS2 that have a fixed voltage level may be applied to the first photogate 130 and the second photogate 140. If the first control signal PGCS1 and the second control signal PGCS2 have the fixed voltage level during the readout time, interferences to the first floating diffusion region 153 and the second floating diffusion region 163 by the first photogate 130 and the second photogate 140 may be reduced. While the first control signal PGCS1 and the second control signal PGCS2 are illustrated as having the second logic level during the readout time, the first control signal PGCS1 and the second control signal PGCS2 may have the first logic level, a fixed voltage level between the first logic level and the second logic level or a varying voltage level.

During the readout time, the third control signal TGCS having the logic low level may be applied to the first transfer gate 151 and the second transfer gate 152. When the third control signal TGCS has the logic low level, the substrate region under the first transfer gate may form a potential barrier that prevents charges from being transferred from the first charge collection region 121 to the first floating diffusion region 153 or from the first floating diffusion region 153 to the first charge collection region 121. The substrate region under the first transfer gate may form a potential barrier between the second charge collection region 122 and the second floating diffusion region 163.

During the readout time, a first data voltage corresponding to the charges accumulated in the first floating diffusion region 153 and a second data voltage corresponding to the charges accumulated in the second floating diffusion region 163 may be outputted, and a first reset voltage corresponding to a voltage of the reset first floating diffusion region 153 and a second reset voltage corresponding to a voltage of the reset second floating diffusion region 163 may be outputted.

The photo detecting apparatus including the unit pixel may generate image and/or depth information based on a voltage difference between the first data voltage and the first reset voltage and a voltage difference between the second data voltage and the second reset voltage, thereby reducing a noise and improving the quality of the image and/or the depth information.

While the intensity of the transmitted light TX, the first control signal PGCS1 and the second control signal PGCS2 are illustrated in FIG. 8 as pulse train signals that have successive pulses during the integration time, the intensity of the transmitted light TX, the first control signal PGCS1 and the second control signal PGCS2 may be sine signals, cosine signals, or the like.

Figure 9A:
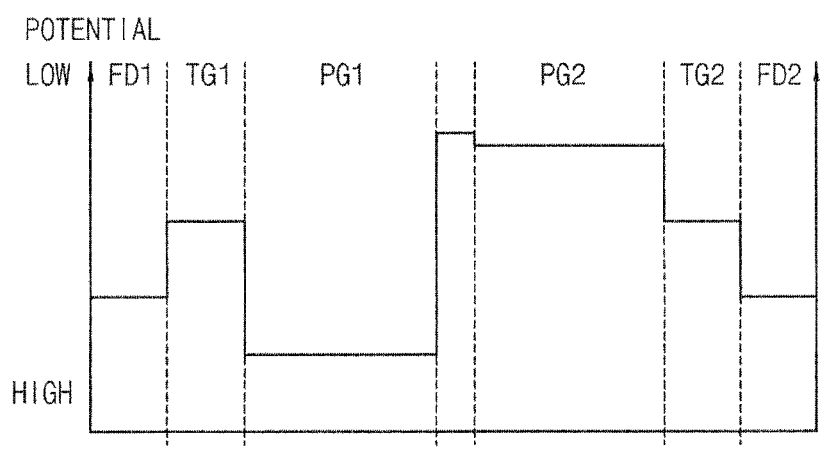
FIGS. 9A and 9B are diagrams illustrating potential levels of the unit pixel of FIG. 1 operated by the method of FIG. 7.
Figure 9B:
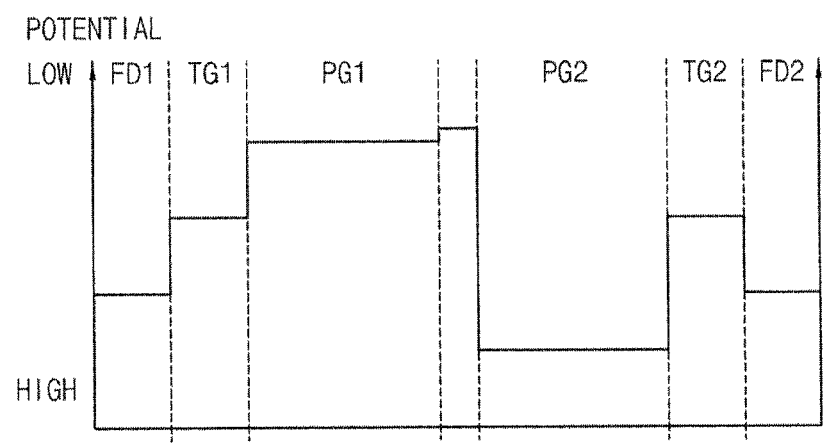

FIGS. 9A and 9B are diagrams illustrating potential levels of the unit pixel of FIG. 1 operated by the method of FIG. 7.

In FIGS. 9A and 9B, potential levels of the unit pixel 100 of FIGS. 1 through 5 are illustrated during an integration time. Here, a positive direction of Y-axis corresponds to a direction where a potential level becomes lower and an electron has higher energy.

In FIG. 9A, the potential levels of the unit pixel 100 of FIGS. 1 through 5 during a time period (e.g., t2 through t3) when a first control signal PGCS1 has a first logic level and a second control signal PGCS2 has a second logic level are illustrated.

Referring to FIGS. 1, 5 and 9A, when the first control signal PGCS1 has the first logic level, a first charge collection region 121 generated by a first photogate 130 may collect charges generated in a semiconductor substrate 110.

When the second control signal PGCS2 has the second logic level, a substrate region (i.e., a transfer channel) under a second transfer gate 161 may have a voltage level (or a potential level) higher than that of a substrate region (i.e., a second charge collection region 122) under a second photogate 140. Accordingly, charges previously collected in the second charge collection region 122 may be transferred through the transfer channel to a second floating diffusion region 163.

As described above, when the first control signal PGCS1 has the first logic level and the second control signal PGCS2 has the second logic level, a first half-pixel including the first photogate 130 may perform a charge collection operation, and a second half-pixel including the second photogate 140 may perform a charge transfer operation.

In FIG. 9B, the potential levels of the unit pixel 100 of FIGS. 1 through 5 during a time period (e.g., t3 through t4) when a first control signal PGCS1 has a second logic level and a second control signal PGCS2 has a first logic level are illustrated.

Referring to FIGS. 1, 5 and 9B, when the first control signal PGCS1 has the second logic level, a substrate region (i.e., a transfer channel) under a first transfer gate 151 may have a voltage level higher than that of a substrate region (i.e., a first charge collection region 121) under a first photogate 130. Accordingly, charges previously collected in the first charge collection region 121 may be transferred through the transfer channel to a first floating diffusion region 153.

When the second control signal PGCS2 has the first logic level, a second charge collection region 122 generated by a second photogate 140 may collect charges generated in a semiconductor substrate 110.

As described above, when the first control signal PGCS1 has the second logic level and the second control signal PGCS2 has the first logic level, a first half-pixel including the first photogate 130 may perform a charge transfer operation, and a second half-pixel including the second photogate 140 may perform a charge collection operation.

Figure 10:
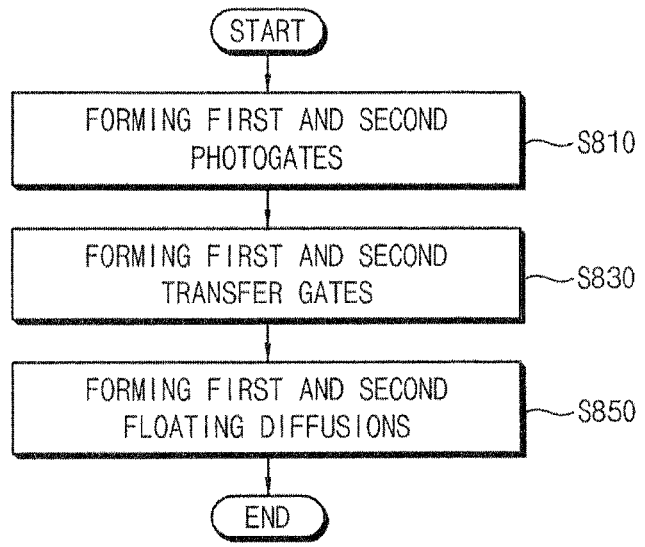
FIG. 10 is a flow chart illustrating a method of forming a unit pixel included in a photo detecting apparatus according to an exemplary embodiment.

FIG. 10 is a flow chart illustrating a method of forming a unit pixel included in a photo detecting apparatus according to an exemplary embodiment.

Referring to FIGS. 1 and 10, a first photogate 130 and a second photogate 140 are formed over a semiconductor substrate 110 (step S810). The first photogate 130 and the second photogate 140 may be disposed point-symmetrically without an overlapped region. In an exemplary embodiment, the first photogate 130 and the second photogate 140 may be formed of transparent conducting oxide (TCO), such as indium tin oxide (ITO), indium zinc oxide (IZO), zinc oxide (ZnO), titanium dioxide ($TiO_2$), etc.

A first transfer gate 151 and a second transfer gate 161 are formed over the semiconductor substrate 110 (step S830). The first transfer gate 151 and the second transfer gate 161 may be formed adjacent to the first photogate 130 and the second photogate 140, respectively.

A first floating diffusion region 153 and a second floating diffusion region 163 are formed in the semiconductor substrate 110 (step S850). The first floating diffusion region 153 and the second floating diffusion region 163 may be formed adjacent to the first transfer gate 151 and the second transfer gate 161, respectively.

Figure 11:
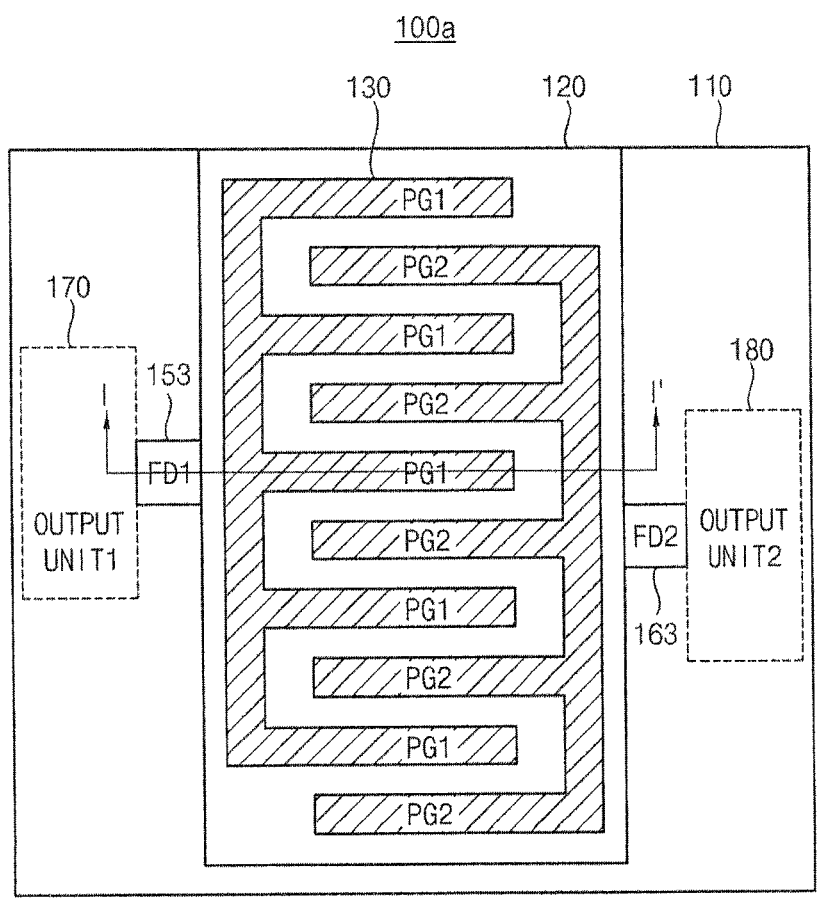
FIG. 11 is a plan view of a unit pixel included in a photo detecting apparatus according to an exemplary embodiment.

FIG. 11 is a plan view of a unit pixel included in a photo detecting apparatus according to an exemplary embodiment.

Referring to FIG. 11, a unit pixel 100a includes a first photogate 130, a second photogate 140, a first floating diffusion region 153, a second floating diffusion region 163, a first output unit 170, and a second output unit 180. The unit pixel 100a may be formed without transfer gates.

The first photogate 130 and the second photogate 140 are formed over a semiconductor substrate 110 such that the first photogate 130 and the second photogate 140 are disposed point-symmetrically without an overlapped region. The first photogate 130 may include a first junction gate extending in a first direction and a plurality of first finger gates extending in a second direction substantially perpendicular to the first direction. The second photogate 140 may include a second junction gate extending in the first direction and a plurality of second finger gates extending in the second direction.

The first floating diffusion region 153 is formed in the semiconductor substrate 110 adjacent to the first photogate 130, and the second floating diffusion region 163 is formed in the semiconductor substrate 110 adjacent to the second photogate 160. The first floating diffusion region 153 and the second floating diffusion region 163 may accumulate charges collected by the first photogate 130 and the second photogate 140, respectively.

The first output unit 170 and the second output unit 180 may output electrical signals corresponding to the charges accumulated in the first floating diffusion region 153 and the second floating diffusion region 163, respectively.

Figure 12:
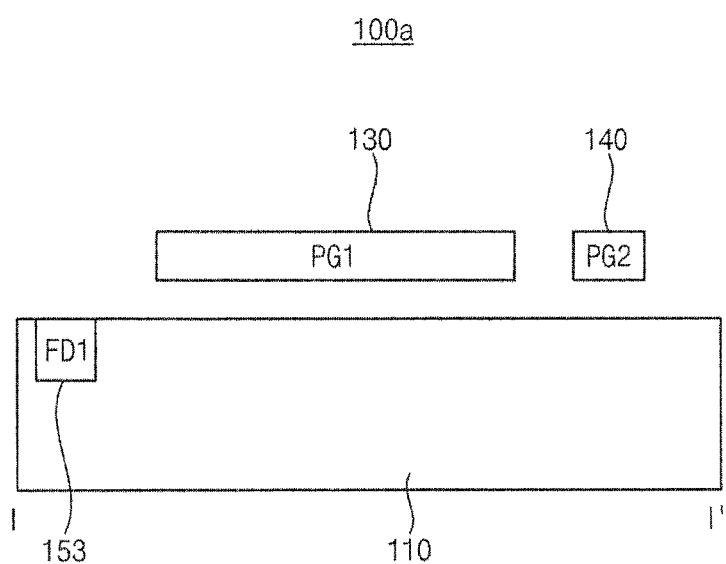
FIG. 12 is a cross-sectional view of an exemplary embodiment of the unit pixel taken along a line I-I' of FIG. 11.

FIG. 12 is a cross-sectional view of an exemplary embodiment of the unit pixel taken along a line I-I' of FIG. 11.

Referring to FIG. 12, a first photogate 130 is formed over a semiconductor substrate 110. A first floating diffusion region 153 may be formed in the semiconductor substrate 110 adjacent to the first photogate 130. A second photogate 140 is formed over the semiconductor substrate 110.

Figure 13:
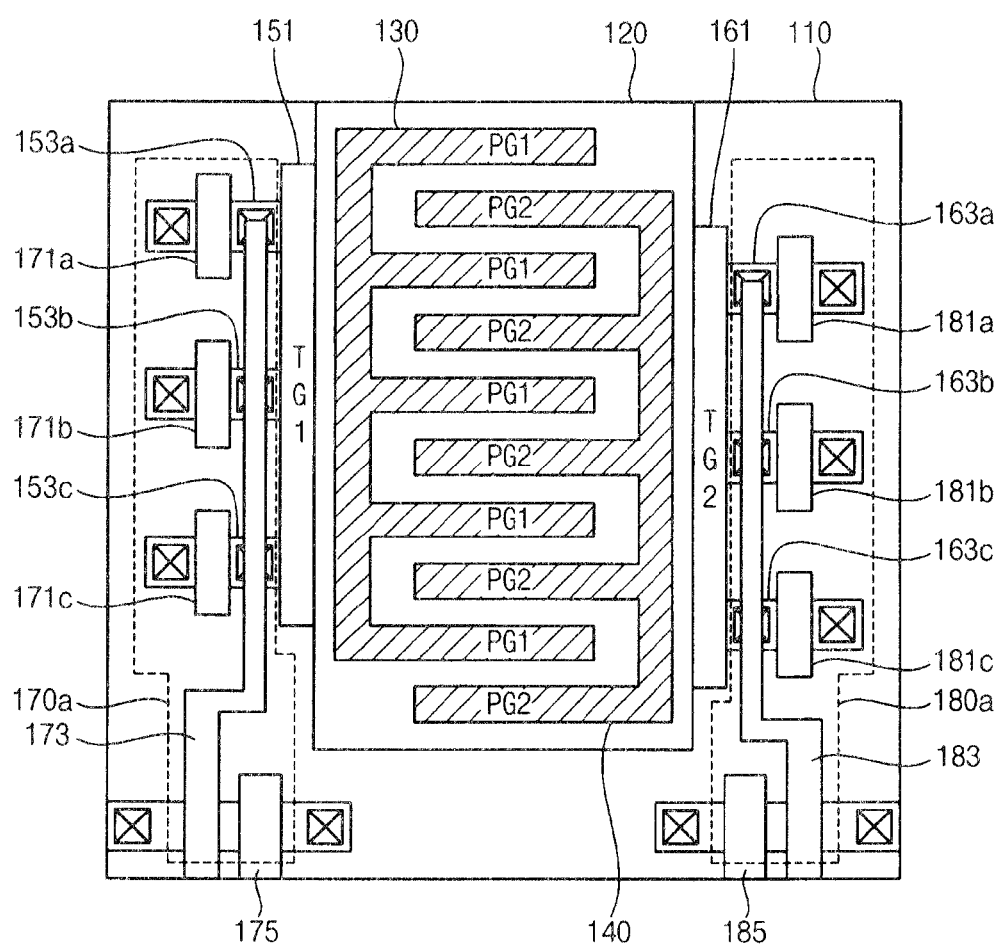
FIG. 13 is a plan view of a unit pixel included in a photo detecting apparatus according to an exemplary embodiment.

FIG. 13 is a plan view of a unit pixel included in a photo detecting apparatus according to an exemplary embodiment.

Referring to FIG. 13, a unit pixel 100*b* includes a first photogate 130, a second photogate 140, a first transfer gate 151, a second transfer gate 161, a plurality of first floating diffusion regions 153*a*, 153*b*, 153*c*, a plurality of second floating diffusion regions 163*a*, 163*b*, 163*c*, a first output unit 170*a*, and a second output unit 180*a*.

The first photogate 130 and the second photogate 140 are formed over a semiconductor substrate 110 such that the first photogate 130 and the second photogate 140 are disposed point-symmetrically without an overlapped region. The first photogate 130 may include a first junction gate extending in a first direction and a plurality of first finger gates extending in a second direction substantially perpendicular to the first direction. The second photogate 140 may include a second junction gate extending in the first direction and a plurality of second finger gates extending in the second direction.

The first transfer gate 151 and the second transfer gate 161 are formed over the semiconductor substrate 110. The first transfer gate 151 may be disposed adjacent to the first junction gate, and the second transfer gate 161 may be disposed adjacent to the second junction gate.

The first floating diffusion regions 153*a*, 153*b*, 153*c* are formed in the semiconductor substrate 110 adjacent to the first transfer gate 151, and the second floating diffusion regions 163*a*, 163*b*, 163*c* are formed in the semiconductor substrate 110 adjacent to the second transfer gate 161. If each half-pixel included in the unit pixel 100 includes a plurality of floating diffusion regions, charge accumulation capacity of the half-pixel may increase. Alternatively, to increase the charge accumulation capacity, the half-pixel may include at least one floating diffusion region and a capacitor coupled to the at least one floating diffusion region. For example, the capacitor may be located in the interior or the exterior of the half-pixel, and may be a metal-oxide-semiconductor (MOS) capacitor, a metal-insulator-metal (MIM) capacitor, or the like.

The first output unit 170*a* and the second output unit 180*a* may output electrical signals corresponding to the charges accumulated in the first floating diffusion regions 153*a*, 153*b*, 153*c* and the second floating diffusion regions 163*a*, 163*b*, 163*c*, respectively. The first output unit 170*a* may include a plurality of first reset transistors 171*a*, 171*b*, 171*c* for discharging the charges accumulated in the first floating diffusion regions 153*a*, 153*b*, 153*c*, respectively. The second output unit 180*a* may include a plurality of second reset transistors 181*a*, 181*b*, 181*c* for discharging the charges accumulated in the second floating diffusion regions 163*a*, 163*b*, 163*c*, respectively.

Figure 14:
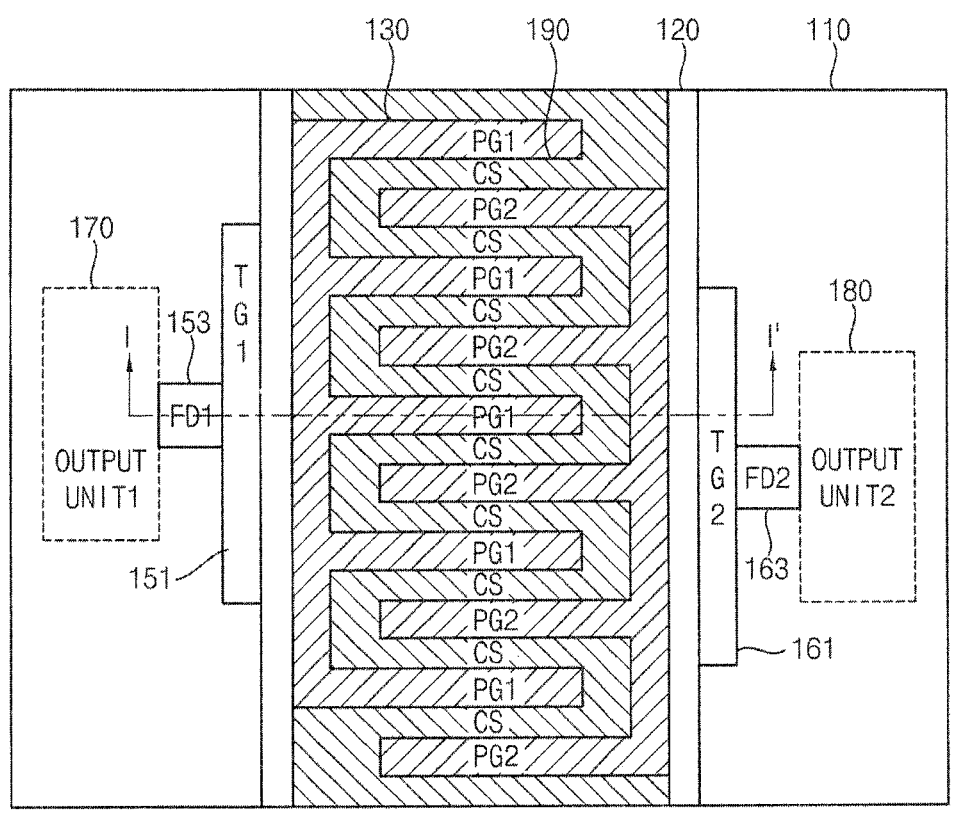
FIG. 14 is a plan view of a unit pixel included in a photo detecting apparatus according to an exemplary embodiment.

FIG. 14 is a plan view of a unit pixel included in a photo detecting apparatus according to an exemplary embodiment.

Referring to FIG. 14, a unit pixel 100*c* includes a first photogate 130, a second photogate 140, a first transfer gate 151, a second transfer gate 161, a first floating diffusion region 153, a second floating diffusion region 163, a first output unit 170, a second output unit 180, and a channel stop region 190.

The first photogate 130 and the second photogate 140 are formed over a semiconductor substrate 110 such that the first photogate 130 and the second photogate 140 are disposed point-symmetrically without an overlapped region. The first photogate 130 may include a first junction gate extending in a first direction and a plurality of first finger gates extending in a second direction substantially perpendicular to the first direction. The second photogate 140 may include a second junction gate extending in the first direction and a plurality of second finger gates extending in the second direction.

The channel stop region 190 is formed between the first photogate 130 and the second photogate 140. The channel stop region 190 may be formed in a substrate region between a first charge collection region generated by the first photogate 130 and a second charge collection region generated by the second photogate 140.

The channel stop region 190 may prevent charges from being transferred from the first charge collection region to the second charge collection region or from the second charge collection region to the first charge collection region. For example, when a first control signal having a first logic level is applied to the first photogate 130, the channel stop region 190 may prevent the charges collected in the second charge collection region from being transferred to the first charge collection region. When a second control signal having the first logic level is applied to the second photogate 140, the channel stop region 190 may prevent the charges collected in the first charge collection region from being transferred to the second charge collection region.

As described above, since the unit pixel 100*c* includes the channel stop region 190 that forms a charge (potential) barrier between the first charge collection region and the second charge collection region, a noise and a data error caused by a charge transfer between half-pixels may be reduced.

Figure 15:
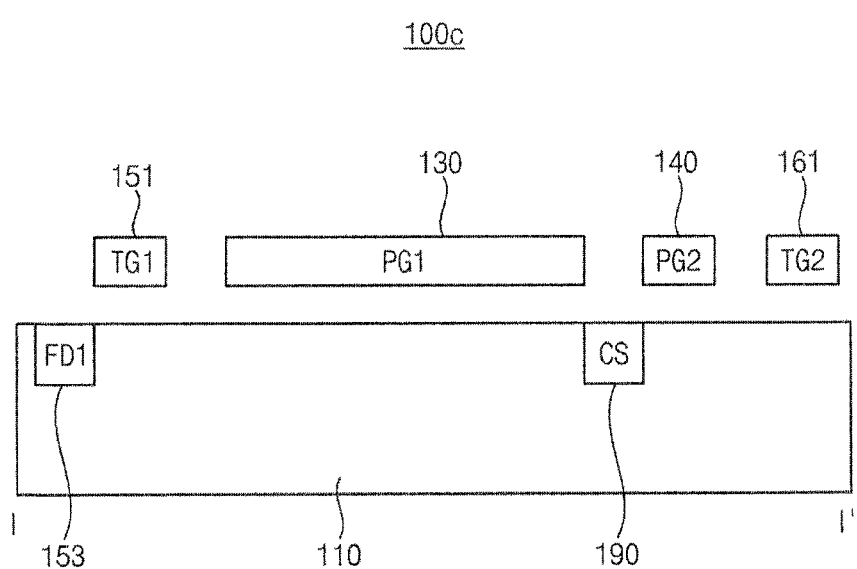
FIG. 15 is a cross-sectional view of an exemplary embodiment of the unit pixel taken along a line I-I' of FIG. 14.

FIG. 15 is a cross-sectional view of an exemplary embodiment of the unit pixel taken along a line I-I' of FIG. 14.

Referring to FIG. 15, a first photogate 130 is formed over a semiconductor substrate 110. A first transfer gate 151 may be formed over the semiconductor substrate 110 adjacent to the first photogate 130. A first floating diffusion region 153 may be formed in the semiconductor substrate 110 adjacent to the first transfer gate 151.

A second photogate 140 is formed over the semiconductor substrate 110. A second transfer gate 161 may be formed over the semiconductor substrate 110 adjacent to the second photogate 140.

A channel stop region 190 may be formed in the semiconductor substrate 110 between the first photogate 130 and the second photogate 140. The channel stop region 190 may be heavily doped with p-type impurities.

Figure 16:
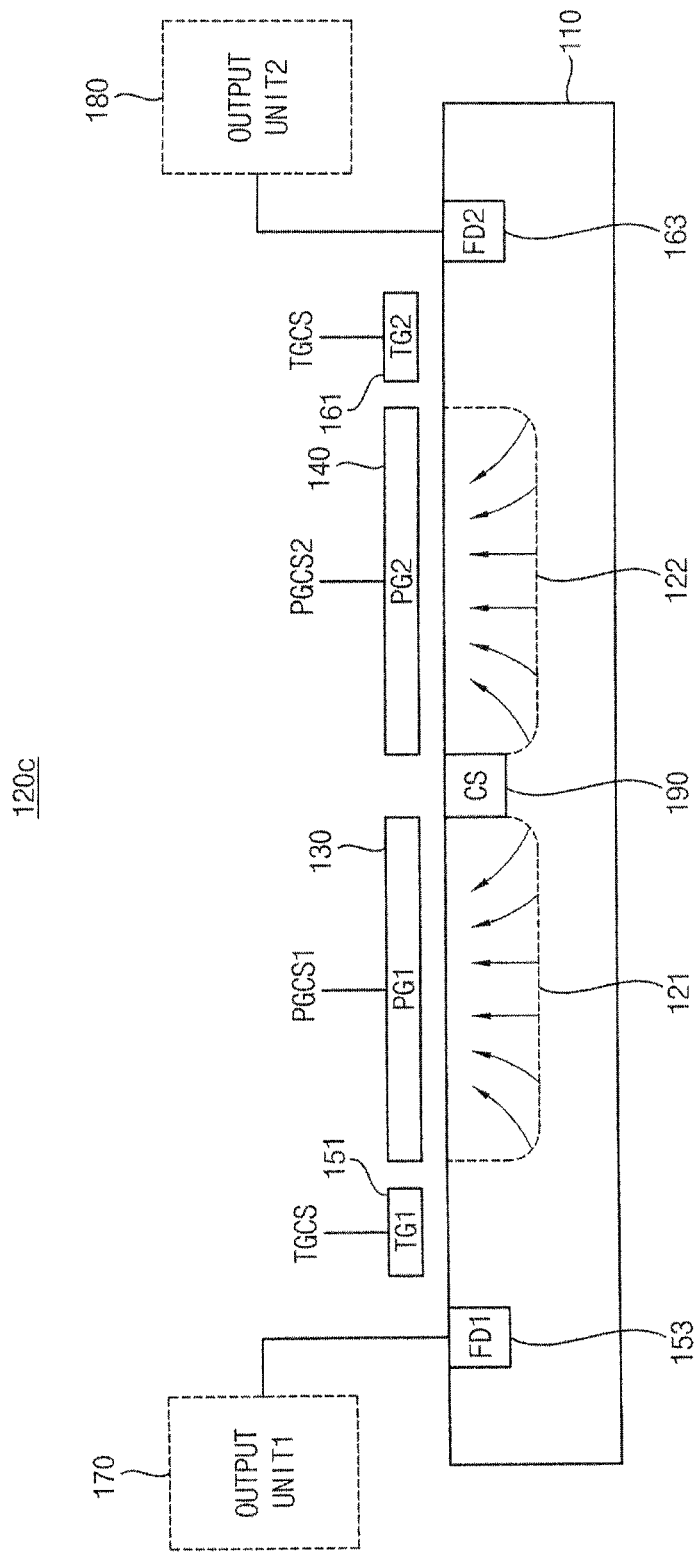
FIG. 16 is a schematic cross-sectional view for illustrating operations of the unit pixel of FIG. 14.

FIG. 16 is a schematic cross-sectional view for illustrating operations of the unit pixel of FIG. 14.

Referring to FIG. 16, a unit pixel 100*c* includes a first photogate 130, a second photogate 140, a first transfer gate 151, a second transfer gate 161, a first floating diffusion region 153, a second floating diffusion region 163, a first output unit 170, a second output unit 180, and a channel stop region 190.

The first photogate 130 and the second photogate 140 may respectively receive a first control signal PGCS1 and a second control signal PGCS2 that periodically transition between a first logic level and a second logic level during an integration time. While the first control signal PGCS1 has the first logic level, the first photogate 130 may generate a first charge collection region 121 for collecting charges generated in a semiconductor substrate 110. While the second control signal PGCS2 has the first logic level, the second photogate 140 may generate a second charge collection region 122 for collecting charges generated in the semiconductor substrate 110.

The channel stop region 190 may be formed in the semiconductor substrate 110 between the first photogate 130 and the second photogate 140. That is, the channel stop region 190 may be formed between the first charge collection region 121 and the second charge collection region 122. The channel stop region 190 may be heavily doped with p-type impurities.

The channel stop region 190 may form a potential barrier between the first charge collection region 121 and the second charge collection region 122. Accordingly, charge transfers between the first charge collection region 121 and the second charge collection region 122 may be prevented.

Figure 17:
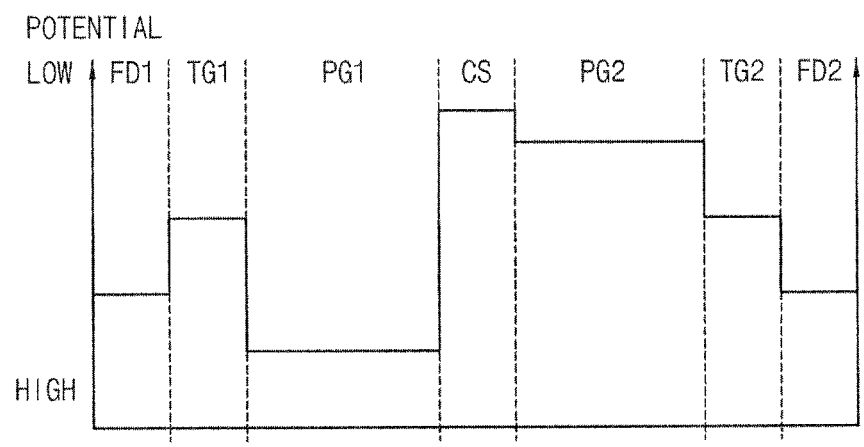
FIG. 17 is a diagram illustrating potential levels of the unit pixel of FIG. 14 operated by the method of FIG. 7.

FIG. 17 is a diagram illustrating potential levels of the unit pixel of FIG. 14 operated by the method of FIG. 7.

In FIG. 17, potential levels of the unit pixel 100c of FIGS. 14 through 16 during a time period when a first control signal PGCS1 has a first logic level and a second control signal PGCS2 has a second logic level are illustrated.

Referring to FIGS. 14 through 17, when the first control signal PGCS1 has the first logic level, a first charge collection region 121 generated by a first photogate 130 may collect charges generated in a semiconductor substrate 110. When the second control signal PGCS2 has the second logic level, charges previously collected in the second charge collection region 122 may be transferred through a transfer channel under a second transfer gate 161 to a second floating diffusion region 163.

The channel stop region 190 may have a voltage level (or a potential level) lower than that of the first charge collection region 121 and that of the second charge collection region 122. The channel stop region 190 may form a potential barrier between the first charge collection region 121 and the second charge collection region 122. Thus, the channel stop region 190 may prevent charge transfers between the first charge collection region 121 and the second charge collection region 122.

Figure 18:
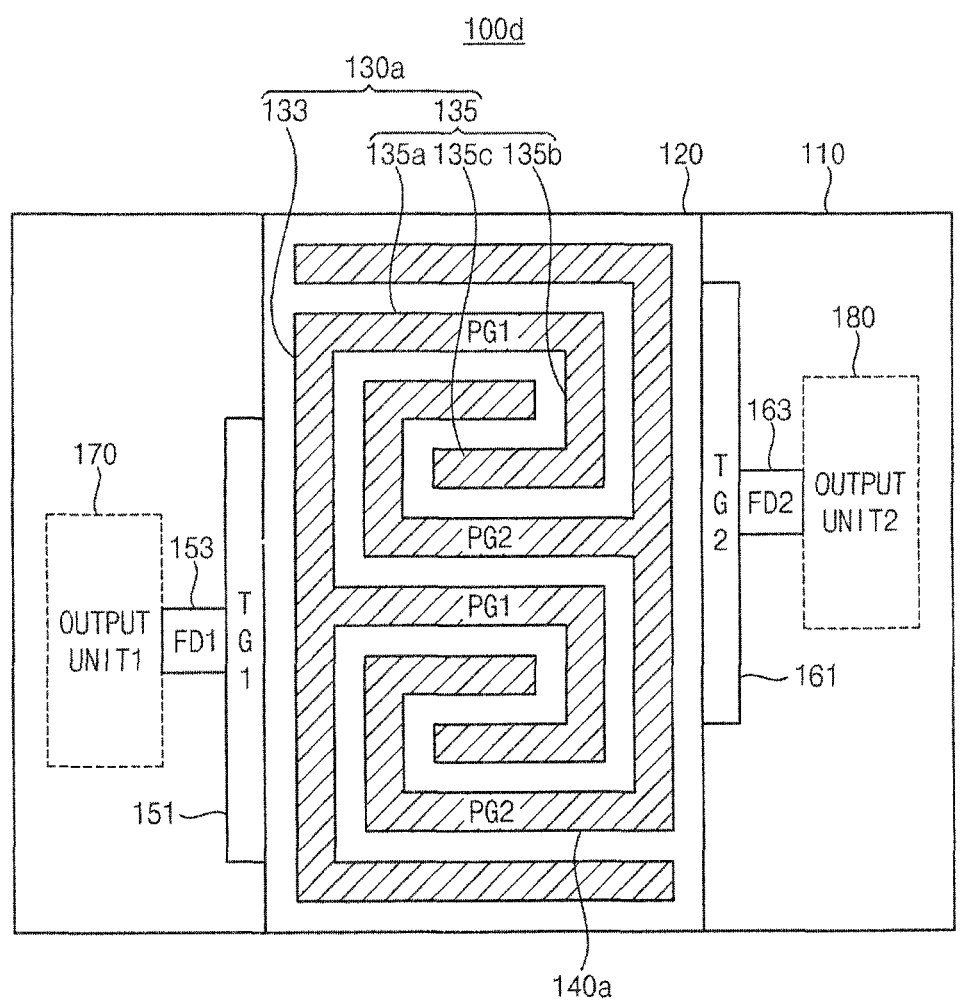
FIG. 18 is a plan view of a unit pixel included in a photo detecting apparatus according to an exemplary embodiment.

FIG. 18 is a plan view of a unit pixel included in a photo detecting apparatus according to an exemplary embodiment.

Referring to FIG. 11, a unit pixel 100d includes a first photogate 130a, a second photogate 140a, a first transfer gate 151, a second transfer gate 161, a first floating diffusion region 153, a second floating diffusion region 163, a first output unit 170, and a second output unit 180.

Each of the first photogate 130a and the second photogate 140a includes at least one spiral finger gate 135. The spiral finger gate 135 may includes gates having bar shapes. The gates included in the spiral finger gate 135 may alternately extend in a first direction and a second direction substantially perpendicular to the first direction, and have gradually shorter lengths.

For example, the spiral finger gate 135 may include a first gate 135a extending from a first junction gate 135 in the positive second direction and having a first length, and a second gate 135b extending from one end of the first gate 135a in the negative first direction and having a second length shorter than the first length. The spiral finger gate 135 may further include a third gate 135c extending from one end of the second gate 135b in the negative second direction and having a third length shorter than the second length. The spiral finger gate 135 may include at least two gates.

The first photogate 130a and the second photogate 140a may be disposed point-symmetrically without an overlapped region. The first photogate 130a and the second photogate 140a may include spiral finger gates 135 being symmetric with each other. Accordingly, the first photogate 130a and the second photogate 140a may cover substantially a whole photo detecting region of a semiconductor substrate.

While each of the first photogate 130a and the second photogate 140a is illustrated in FIG. 18 as including two spiral finger gates 135, the number of spiral finger gates included in the first photogate 130a and the second photogate 140a may be varied.

Each of the first photogate 130a and the second photogate 140a may further include a junction gate 133 extending in the first direction. The junction gate 133 may be coupled to at least one spiral finger gate 135 and/or a finger gate. In an exemplary embodiment, the junction gate 133 and the at least one spiral finger gate 135 may be formed at the same layer. In other embodiments, the junction gate 133 and the spiral finger gate 135 may be formed at different layers. The junction gate 133 may provide a path through which charges collected under the at least one spiral finger gate 135 are transferred. Accordingly, the junction gate 133 may improve charge transfer efficiency of the charges collected under the at least one spiral finger gate 135.

As described above, since each photogate 130a, 140a includes at least one spiral finger gate 135, the unit pixel 100d may cover substantially a whole photo detecting region of a semiconductor substrate.

Figure 19:
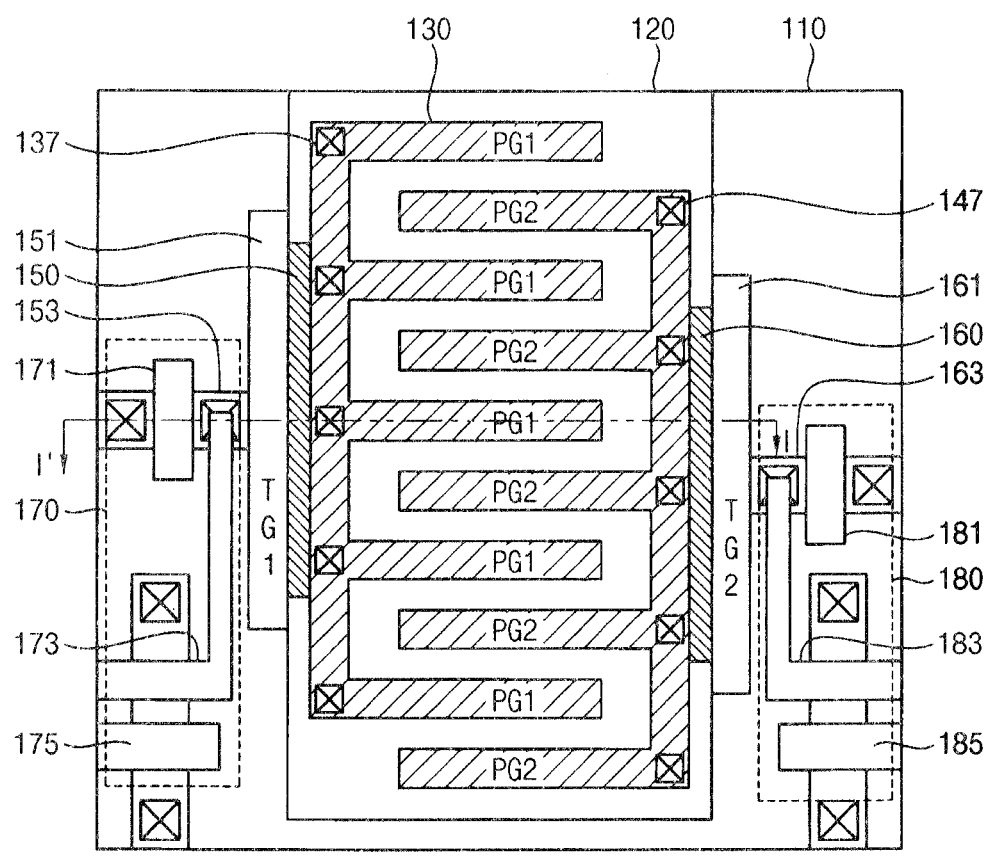
FIG. 19 is a plan view of a unit pixel included in a photo detecting apparatus according to an exemplary embodiment.

FIG. 19 is a plan view of a unit pixel included in a photo detecting apparatus according to an exemplary embodiment.

Referring to FIG. 19, a unit pixel 100e includes a first photogate 130, a second photogate 140, a first bridging diffusion region 150, a second bridging diffusion region 160, a first transfer gate 151, a second transfer gate 161, a first floating diffusion region 153, a second floating diffusion region 163, a first output unit 170, and a second output unit 180.

The first photogate 130 and the second photogate 140 are formed over a semiconductor substrate 110 such that the first photogate 130 and the second photogate 140 are disposed point-symmetrically without an overlapped region. The first photogate 130 and the second photogate 140 may generate a charge collection region 120 for collecting charges generated in the semiconductor substrate 110.

The first photogate 130 may include a first junction gate extending in a first direction and a plurality of first finger gates extending in parallel with one another in a second direction substantially perpendicular to the first direction. The second photogate 140 may include a second junction gate extending in the first direction and a plurality of second finger gates extending in parallel with one another in the second direction.

The first bridging diffusion region 150 and the second bridging diffusion region 160 are formed in the semiconductor substrate 110. The first bridging diffusion region 150 may be formed adjacent to the first junction gate, and the second bridging diffusion region 160 may be formed adjacent to the second junction gate. The first bridging diffusion region 150 and the second bridging diffusion region 160 may have a voltage level higher than a voltage level of the charge collection region 120 when the charge collection region 120 collects electrons, and have a voltage level lower than a voltage level of the charge collection region 120 when the charge collection region 120 collects holes.

Thus, the first bridging diffusion region 150 and the second bridging diffusion region 160 may attract the charges collected in the charge collection region 120, thereby improving efficiency of charge transfers from the charge collection region 120 to the first floating diffusion region 153 and the second floating diffusion region 163. Further, the first bridging diffusion region 150 and the second bridging diffusion region 160 may suppress potential barriers between the charge collection region 120 and a substrate region under the first transfer gate 151 and between the charge collection region 120 and a substrate region under the second transfer gate 161, thereby further improving the charge transfer efficiency.

Figure 20:
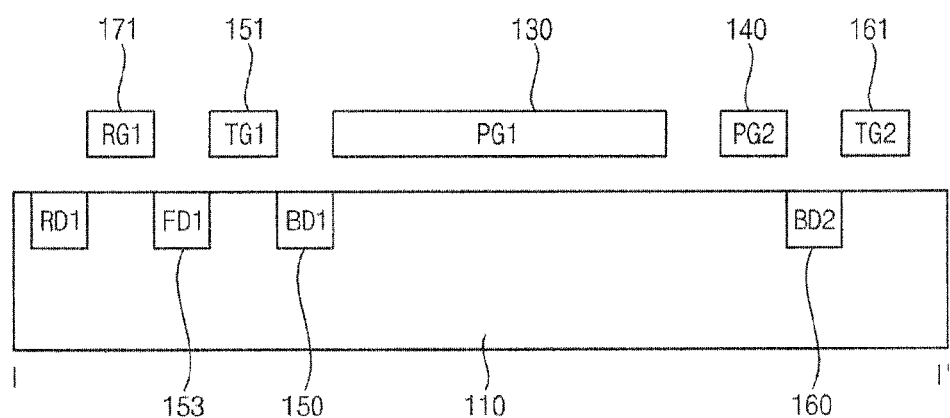
FIG. 20 is a cross-sectional view of an exemplary embodiment of the unit pixel taken along a line I-I' of FIG. 19.

FIG. 20 is a cross-sectional view of an exemplary embodiment of the unit pixel taken along a line I-I' of FIG. 19.

Referring to FIG. 20, a first photogate 130 is formed over a semiconductor substrate 110. A first bridging diffusion region 150 may be formed in the semiconductor substrate 110 adjacent to a first junction gate included in the first photogate 130. A first transfer gate 151 may be formed over the semiconductor substrate 110 adjacent to the first bridging diffusion region 150. A first floating diffusion region 153 may be formed in the semiconductor substrate 110 adjacent to the first transfer gate 151.

A second photogate 140 is formed over the semiconductor substrate 110. A second bridging diffusion region 160 may be formed in the semiconductor substrate 110 adjacent to a second junction gate included in the second photogate 140. A second transfer gate 161 may be formed over the semiconductor substrate 110 adjacent to the second bridging diffusion region 160.

Figure 21:
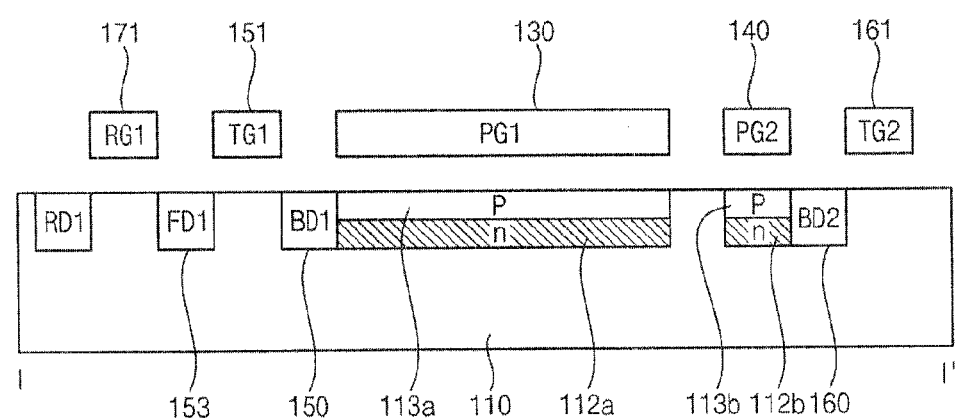
FIG. 21 is a cross-sectional view of an exemplary embodiment of the unit pixel taken along a line I-I' of FIG. 19.

FIG. 21 is a cross-sectional view of an exemplary embodiment of the unit pixel taken along a line I-I' of FIG. 19.

Referring to FIG. 21, the unit pixel 100 further includes a first buried channel 112a and a second buried channel 112b formed in the semiconductor substrate 110. The first buried channel 112a and the second buried channel 112b may be formed near a surface of the semiconductor substrate 110 where the first photogate 130 and the second photogate 140 are overlain. The first buried channel 112a and the second buried channel 112b may be doped with n-type impurities. The unit pixel 100 may further include a first p-type doped region 113a formed in the semiconductor substrate 110 between the first buried channel 112a and the first photogate 130, and a second p-type doped region 113b formed in the semiconductor substrate 110 between the second buried channel 112b and the second photogate 140.

Figure 22:
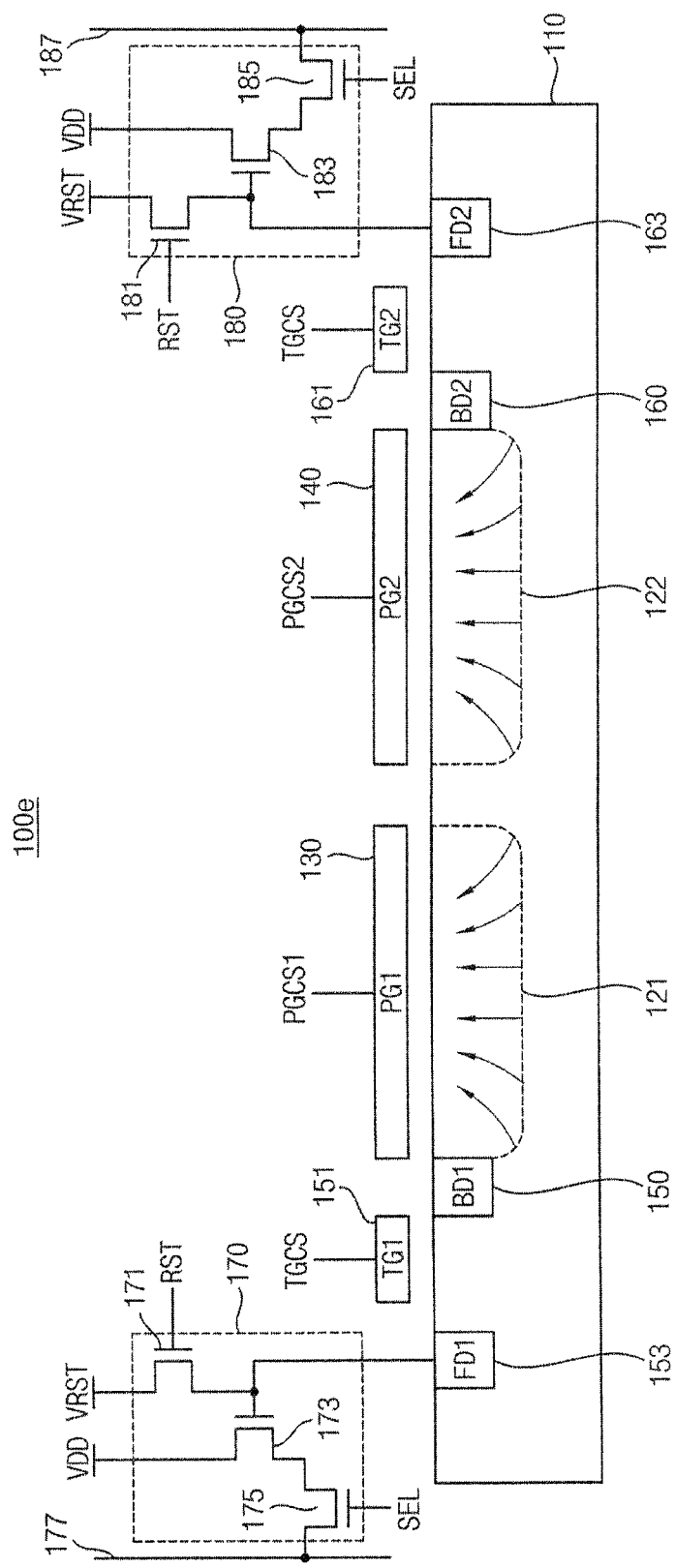
FIG. 22 is a schematic cross-sectional view for illustrating operations of the unit pixel of FIG. 19.

FIG. 22 is a schematic cross-sectional view for illustrating operations of the unit pixel of FIG. 19.

Referring to FIG. 22, a unit pixel 100e includes a first photogate 130, a second photogate 140, a first bridging diffusion region 150, a second bridging diffusion region 160, a first transfer gate 151, a second transfer gate 161, a first floating diffusion region 153, a second floating diffusion region 163, a first output unit 170, and a second output unit 180.

The first photogate 130 and the second photogate 140 may respectively receive a first control signal PGCS1 and a second control signal PGCS2 that periodically transition between a first logic level and a second logic level during an integration time. When the first control signal PGCS1 has the first logic level, the first photogate 130 may generate a first charge collection region 121 for collecting charges generated in a semiconductor substrate 110. When the second control signal PGCS2 has the first logic level, the second photogate 140 may generate a second charge collection region 122 for collecting charges generated in the semiconductor substrate 110.

The first bridging diffusion region 150 is formed in the semiconductor substrate 110 adjacent to the first charge collection region 121, and the second bridging diffusion region 160 is formed in the semiconductor substrate 110 adjacent to the second charge collection region 122. The first bridging diffusion region 150 and the second bridging diffusion region 160 may be heavily doped with n-type impurities.

The first bridging diffusion region 150 may have a voltage level such that the first bridging diffusion region 150 may attract the charges collected in the first charge collection region 121, and the second bridging diffusion region 160 may have a voltage level such that the second bridging diffusion region 160 may attract the charges collected in the second charge collection region 122.

Accordingly, the first bridging diffusion region 150 may improve efficiency of a charge transfer from the first charge collection region 121 through a transfer channel under the first transfer gate 151 to the first floating diffusion region 153, and the second bridging diffusion region 160 may improve efficiency of a charge transfer from the second charge collection region 122 through a transfer channel under the second transfer gate 161 to the second floating diffusion region 163.

Since the unit pixel 100e includes the first bridging diffusion region 150 between the first charge collection region 121 and the transfer channel under the first transfer gate 151, and the second bridging diffusion region 160 between the second charge collection region 122 and the transfer channel under the second transfer gate 161, the charge transfer efficiency from the first charge collection region 121 to the first floating diffusion region 153 and from the second charge collection region 122 to the second floating diffusion region 163 may be improved.

Figure 23:
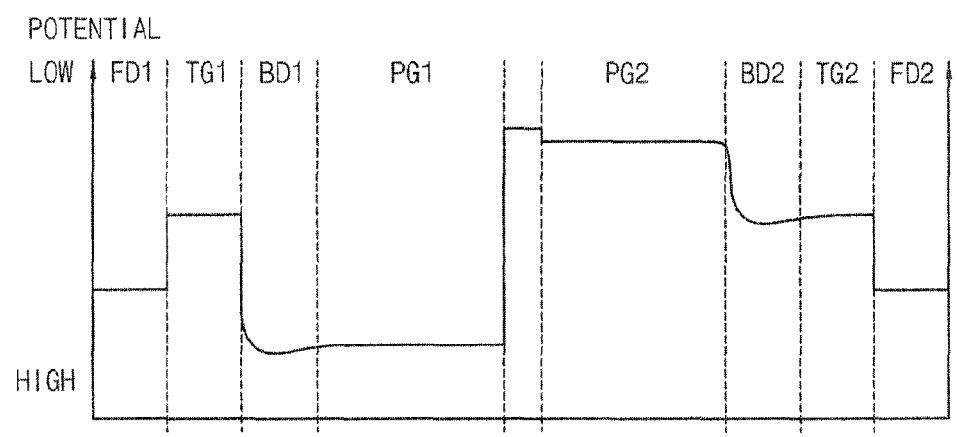
FIG. 23 is a diagram illustrating potential levels of the unit pixel of FIG. 19 operated by the method of FIG. 7.

FIG. 23 is a diagram illustrating potential levels of the unit pixel of FIG. 19 operated by the method of FIG. 7.

In FIG. 23, potential levels of the unit pixel 100e of FIGS. 19 through 22 during a time period when a first control signal PGCS1 has a first logic level and a second control signal PGCS2 has a second logic level are illustrated.

Referring to FIGS. 19 through 23, when the first control signal PGCS1 has the first logic level, a first charge collection region 121 generated by a first photogate 130 may collect charges generated in a semiconductor substrate 110.

When the second control signal PGCS2 has the second logic level, a second bridging diffusion region 160 may have a voltage level higher than that of a second charge collection region 122. Thus, the second bridging diffusion region 160 may attract charges collected in the second charge collection region 122. Further, the second bridging diffusion region 160 may suppress a potential barrier between the second charge collection region 122 and a substrate region under a second transfer gate 161. Accordingly, the efficiency of the charge transfer from the second charge collection region 122 through the second bridging diffusion region 160 and a transfer channel under the second transfer gate 161 to a floating diffusion region 163 may be improved.

Figure 24:
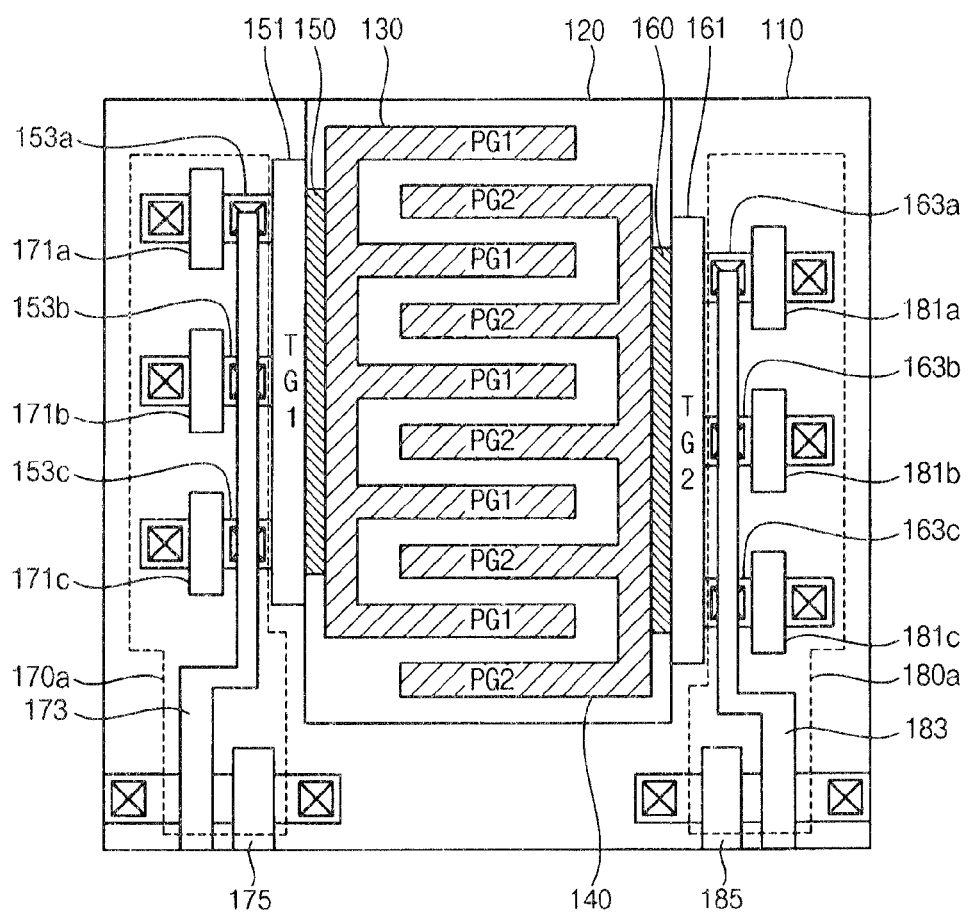
FIG. 24 is a plan view of a unit pixel included in a photo detecting apparatus according to an exemplary embodiment.

FIG. 24 is a plan view of a unit pixel included in a photo detecting apparatus according to an exemplary embodiment.

Referring to FIG. 24, a unit pixel 100f includes a first photogate 130, a second photogate 140, a first bridging diffusion region 150, a second bridging diffusion region 160, a first transfer gate 151, a second transfer gate 161, a plurality of first floating diffusion regions 153a, 153b, 153c, a plurality of second floating diffusion regions 163a, 163b, 163c, a first output unit 170a, and a second output unit 180a.

The first photogate 130 and the second photogate 140 are formed over a semiconductor substrate 110 such that the first photogate 130 and the second photogate 140 are disposed point-symmetrically without an overlapped region. The first bridging diffusion region 150 and the second bridging diffusion region 160 are formed in the semiconductor substrate 110 and adjacent to the first photogate 130 and the second photogate 140, respectively. The first transfer gate 151 and the second transfer gate 161 are formed over the semiconductor substrate 110 and adjacent to the first bridging diffusion region 150 and the second bridging diffusion region 160, respectively. The first floating diffusion regions 153a, 153b, 153c and the second floating diffusion regions 163a, 163b, 163c are formed in the semiconductor substrate 110 and adjacent to the first transfer gate 151 and the second transfer gate 161, respectively.

Since the unit pixel 100f includes the first bridging diffusion region 150 between the first photogate 130 and the first transfer gate 151, and the second bridging diffusion region 160 between the second photogate 140 and the second transfer gate 161, the charge transfer efficiency may be improved. In addition, since the unit pixel 100f further includes first floating diffusion regions 153a, 153b, 153c adjacent to the first transfer gate 151, and the second floating diffusion regions 163a, 163b, 163c adjacent to the second transfer gate 161, the charge accumulation capacity may be increased.

Figure 25:
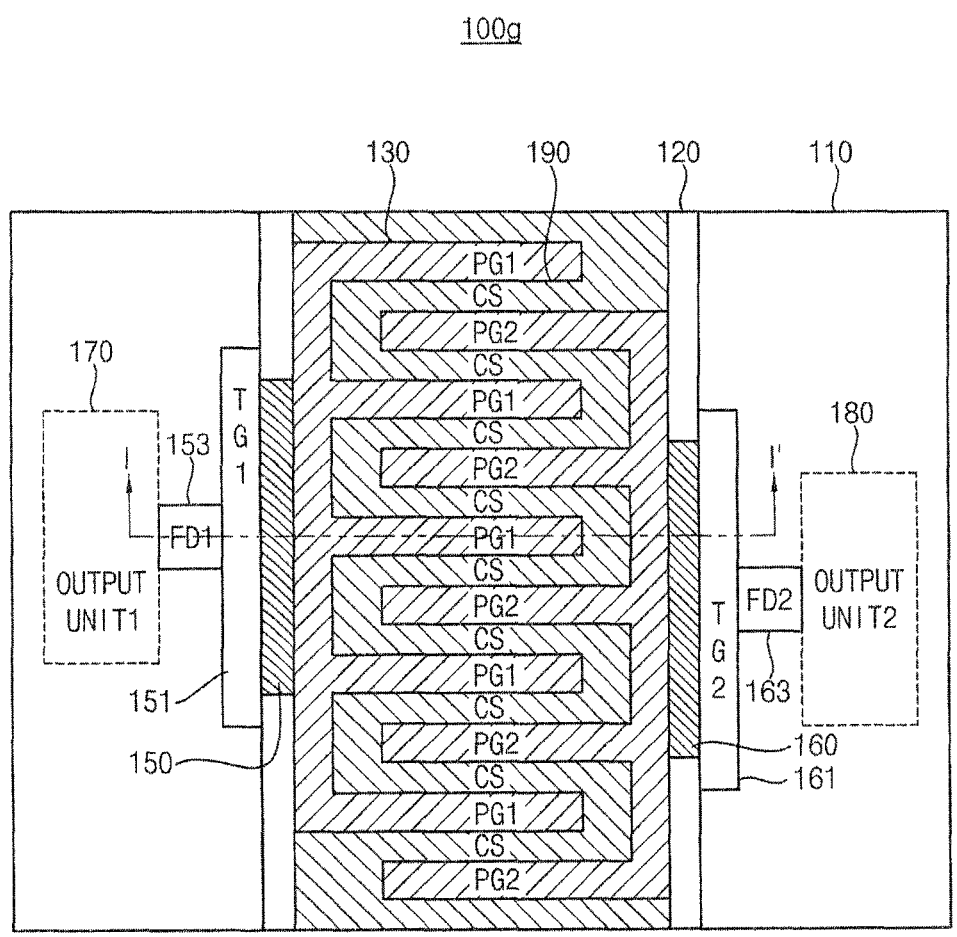
FIG. 25 is a plan view of a unit pixel included in a photo detecting apparatus according to an exemplary embodiment.

FIG. 25 is a plan view of a unit pixel included in a photo detecting apparatus according to an exemplary embodiment.

Referring to FIG. 25, a unit pixel 100g includes a first photogate 130, a second photogate 140, a first bridging diffusion region 150, a second bridging diffusion region 160, a first transfer gate 151, a second transfer gate 161, a first floating diffusion region 153, a second floating diffusion region 163, a first output unit 170, a second output unit 180, and a channel stop region 190.

The first photogate 130 and the second photogate 140 are formed over a semiconductor substrate 110 such that the first photogate 130 and the second photogate 140 are disposed point-symmetrically without an overlapped region. The first bridging diffusion region 150 and the second bridging diffusion region 160 are formed in the semiconductor substrate 110 and adjacent to the first photogate 130 and the second photogate 140, respectively. The channel stop region 190 is formed in the semiconductor substrate 110 between the first photogate 130 and the second photogate 140.

The channel stop region 190 may be formed in a substrate region between a first charge collection region generated by the first photogate 130 and a second charge collection region generated by the second photogate 140.

Since the unit pixel 100g includes the first bridging diffusion region 150 between the first photogate 130 and the first transfer gate 151, and the second bridging diffusion region 160 between the second photogate 140 and the second transfer gate 161, the charge transfer efficiency may be improved. In addition, since the unit pixel 100g includes the channel stop region 190 forming a potential barrier between the first photogate 130 and the second photogate 140, a noise and a data error caused by a charge transfer between half-pixels may be reduced.

Figure 26:
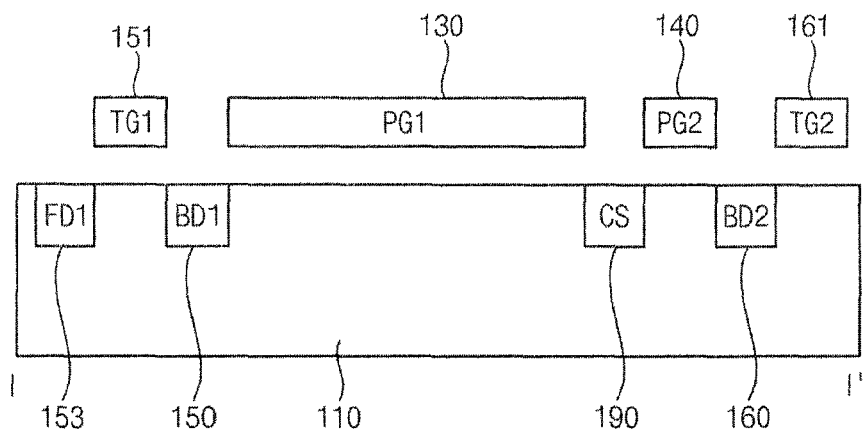
FIG. 26 is a cross-sectional view of an exemplary embodiment of the unit pixel taken along a line I-I' of FIG. 25.

FIG. 26 is a cross-sectional view of an exemplary embodiment of the unit pixel taken along a line I-I' of FIG. 25.

Referring to FIG. 26, a first photogate 130 is formed over a semiconductor substrate 110. A first bridging diffusion region 150 may be formed in the semiconductor substrate 110 adjacent to a first junction gate included in the first photogate 130. A first transfer gate 151 may be formed over the semiconductor substrate 110 adjacent to the first bridging diffusion region 150. A first floating diffusion region 153 may be formed in the semiconductor substrate 110 adjacent to the first transfer gate 151.

A second photogate 140 is formed over the semiconductor substrate 110. A second bridging diffusion region 160 may be formed in the semiconductor substrate 110 adjacent to a second junction gate included in the second photogate 140. A second transfer gate 161 may be formed over the semiconductor substrate 110 adjacent to the second bridging diffusion region 160.

A channel stop region 190 may be formed in the semiconductor substrate 110 between the first photogate 130 and the second photogate 140. The channel stop region 190 may be heavily doped with p-type impurities.

Figure 27:
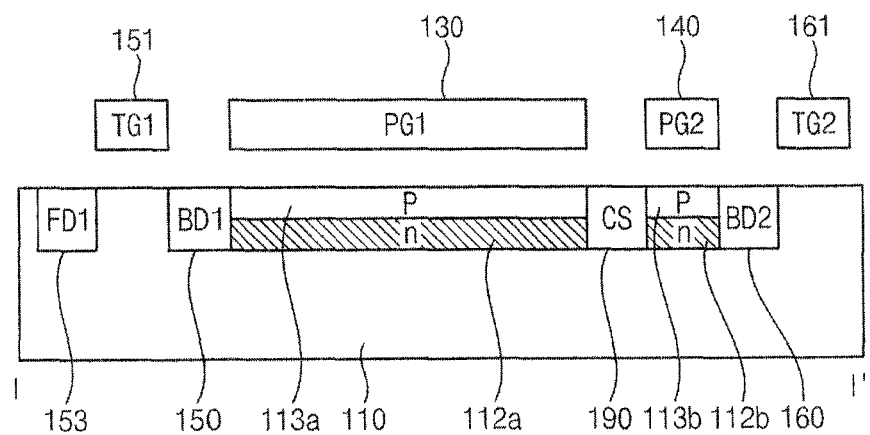
FIG. 27 is a cross-sectional view of an exemplary embodiment of the unit pixel taken along a line I-I' of FIG. 25.

FIG. 27 is a cross-sectional view of an exemplary embodiment of the unit pixel taken along a line I-I' of FIG. 25.

Referring to FIG. 27, the unit pixel 100 further includes a first buried channel 112a and a second buried channel 112b formed in the semiconductor substrate 110. The first buried channel 112a and the second buried channel 112b may be formed near a surface of the semiconductor substrate 110 where the first photogate 130 and the second photogate 140 are overlain. The first buried channel 112a and the second buried channel 112b may be doped with n-type impurities. The unit pixel 100 may further include a first p-type doped region 113a formed in the semiconductor substrate 110 between the first buried channel 112a and the first photogate 130, and a second p-type doped region 113b formed in the semiconductor substrate 110 between the second buried channel 112b and the second photogate 140.

Figure 28:
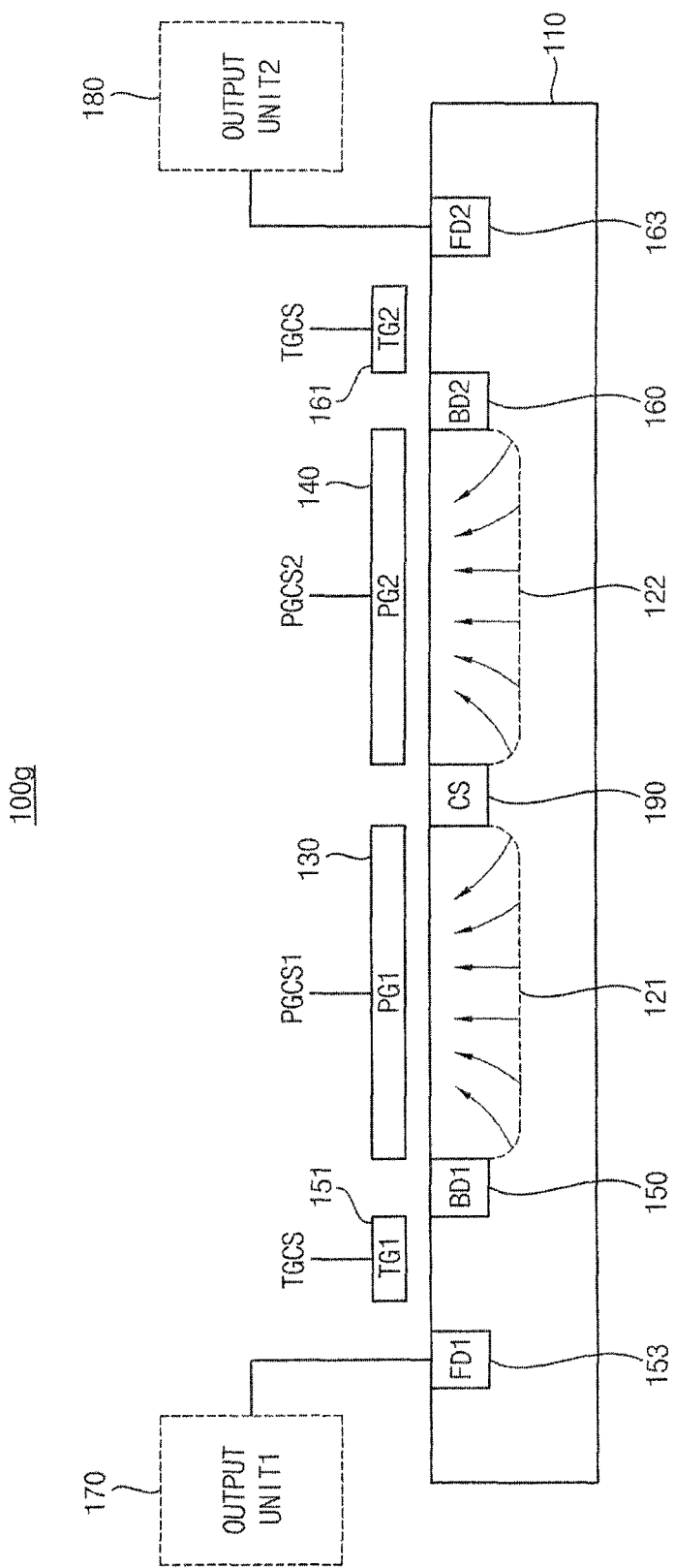
FIG. 28 is a schematic cross-sectional view for illustrating operations of the unit pixel of FIG. 25.

FIG. 28 is a schematic cross-sectional view for illustrating operations of the unit pixel of FIG. 25.

Referring to FIG. 28, a unit pixel 100g includes a first photogate 130, a second photogate 140, a first bridging diffusion region 150, a second bridging diffusion region 160, a first transfer gate 151, a second transfer gate 161, a first floating diffusion region 153, a second floating diffusion region 163, a first output unit 170, a second output unit 180, and a channel stop region 190.

The first bridging diffusion region 150 is formed in a semiconductor substrate 110 adjacent to a first charge collection region 121, and the second bridging diffusion region 160 is formed in the semiconductor substrate 110 adjacent to second charge collection region 122. The first bridging diffusion region 150 may have a voltage level such that the first bridging diffusion region 150 attracts charges collected in the first charge collection region 121, and the second bridging diffusion region 160 may have a voltage level such that the second bridging diffusion region 160 attracts charges collected in the second charge collection region 122. Accordingly, the first bridging diffusion region 150 may improve efficiency of a charge transfer from the first charge collection region 121 through a transfer channel under the first transfer gate 151 to the first floating diffusion region 153, and the second bridging diffusion region 160 may improve efficiency of a charge transfer from the second charge collection region 122 through a transfer channel under the second transfer gate 161 to the second floating diffusion region 163.

The channel stop region 190 is formed in the semiconductor substrate 110 between the first photogate 130 and the second photogate 140. That is, the channel stop region 190 is formed between the first charge collection region 121 and the second charge collection region 122. The channel stop region 190 may form a potential barrier between the first charge collection region 121 and the second charge collection region 122. Accordingly, charge transfers between the first charge collection region 121 and the second charge collection region 122 may be prevented.

Figure 29:
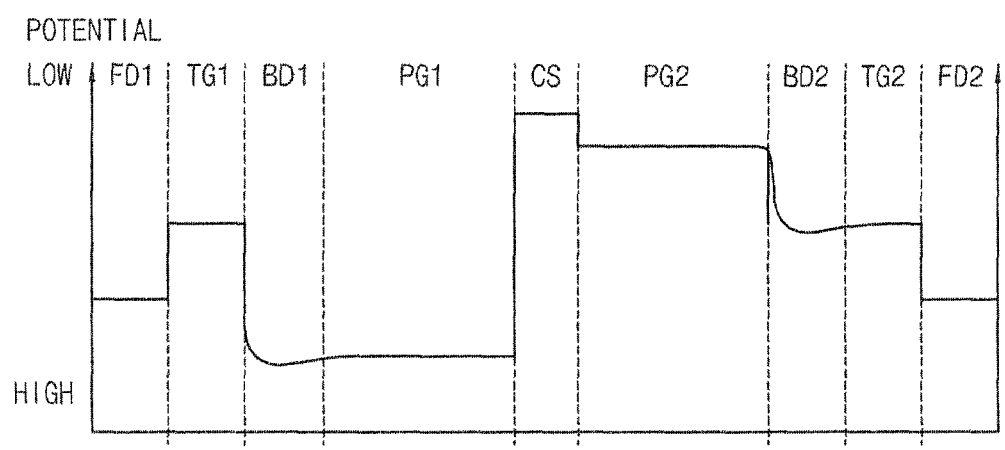
FIG. 29 is a diagram illustrating potential levels of the unit pixel of FIG. 25 operated by the method of FIG. 7.

FIG. 29 is a diagram illustrating potential levels of the unit pixel of FIG. 25 operated by the method of FIG. 7.

In FIG. 29, potential levels of the unit pixel 100c of FIGS. 25 through 28 during a time period when a first control signal PGCS1 has a first logic level and a second control signal PGCS2 has a second logic level are illustrated.

Referring to FIGS. 25 through 29, when the first control signal PGCS1 has the first logic level, a first charge collection region 121 generated by a first photogate 130 may collect charges generated in a semiconductor substrate 110.

When the second control signal PGCS2 has the second logic level, a second bridging diffusion region 160 may have a voltage level higher than that of a second charge collection region 122. Thus, the second bridging diffusion region 160 may attract charges collected in the second charge collection region 122. Further, the second bridging diffusion region 160 may suppress a potential barrier between the second charge collection region 122 and a substrate region under a second transfer gate 161. Accordingly, the efficiency of the charge transfer from the second charge collection region 122 through the second bridging diffusion region 160 and a transfer channel under the second transfer gate 161 to a floating diffusion region 163 may be improved.

The channel stop region 190 may have a voltage level lower than that of the first charge collection region 121 and that of the second charge collection region 122. The channel stop region 190 may form a potential barrier between the first charge collection region 121 and the second charge collection region 122. Thus, the channel stop region 190 may prevent charge transfers between the first charge collection region 121 and the second charge collection region 122.

Figure 30:
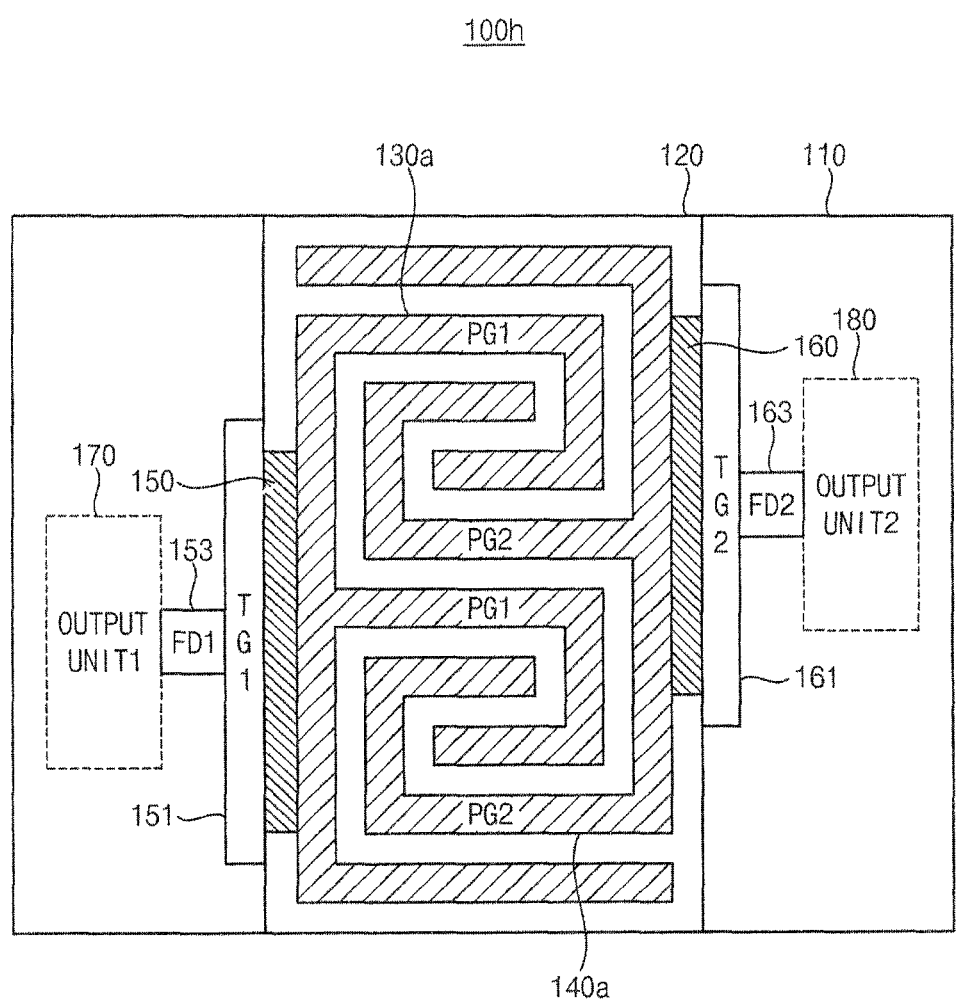
FIG. 30 is a plan view of a unit pixel included in a photo detecting apparatus according to an exemplary embodiment.

FIG. 30 is a plan view of a unit pixel included in a photo detecting apparatus according to an exemplary embodiment.

Referring to FIG. 30, a unit pixel 100h includes a first photogate 130a, a second photogate 140a, a first bridging diffusion region 150, a second bridging diffusion region 160, a first transfer gate 151, a second transfer gate 161, a first floating diffusion region 153, a second floating diffusion region 163, a first output unit 170, and a second output unit 180.

Each of the first photogate 130a and the second photogate 140a includes at least one spiral finger gate. The first bridging diffusion region 150 and the second bridging diffusion region 160 are formed in the semiconductor substrate 110 and adjacent to the first photogate 130 and the second photogate 140, respectively.

Since each photogate 130a and 140a includes at least one spiral finger gate, the unit pixel 100h may cover substantially a whole photo detecting region of a semiconductor substrate. Further, since the unit pixel 100h includes the first bridging diffusion region 150 between the first photogate 130 and the first transfer gate 151, and the second bridging diffusion region 160 between the second photogate 140 and the second transfer gate 161, the charge transfer efficiency may be improved.

Figure 31:
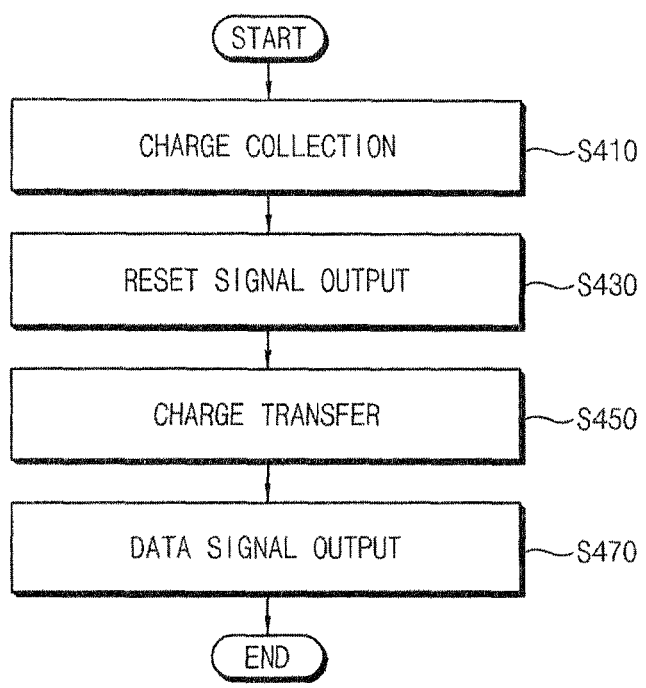
FIG. 31 is a flow chart illustrating a method of operating a unit pixel included in a photo detecting apparatus according to an exemplary embodiment.

FIG. 31 is a flow chart illustrating a method of operating a unit pixel included in a photo detecting apparatus according to an exemplary embodiment.

Referring to FIGS. 22 and 31, during an integration time, a first charge collection region 121 and a second charge collection region 122 collect charges generated in a semiconductor substrate 110 (step S410).

When a first control signal PGCS1 has a first logic level (e.g., logic high level), the first photogate 130 may be turned on and the first charge collection region 121 may collect the charges generated in a semiconductor substrate 110. When a second control signal PGCS2 has the first logic level, the second photogate 140 may be turned on and the second charge collection region 122 may collect the charges generated in a semiconductor substrate 110. A first bridging diffusion region 150 and a second bridging diffusion region 160 included in a unit pixel operated by the method of FIG. 31 may have larger storage capacity than a unit pixel operated by the method of FIG. 7. The first bridging diffusion region 150 and the second bridging diffusion region 160 may store the charges collected in the first charge collection region 121 and the second charge collection region 122, respectively.

After the integration time, a first output unit 170 outputs a first reset voltage to a first column line 177, and a second output unit 180 outputs a second reset voltage to a second column line 187 (step S430).

A first reset transistor 171 may reset a first floating diffusion region 153 in response to a reset signal RST, and a second reset transistor 181 may reset a second floating diffusion region 163 in response to the reset signal RST. A first drive transistor 173 may generate the first reset voltage by amplifying a voltage of the reset first floating diffusion region 153, and the first select transistor 175 may output the first reset voltage to the first column line 177 in response to the select signal SEL. The second drive transistor 183 may generate the second reset voltage by amplifying a voltage of the reset second floating diffusion region 163, and the second select transistor 185 may output the second reset voltage to the second column line 187 in response to the select signal SEL.

After outputting the first reset voltage and the second reset voltage, the charges stored in the first bridging diffusion region 150 and the second bridging diffusion region 160 are transferred to the first floating diffusion region 153 and the second floating diffusion region 163, respectively (step S450).

When a third control signal TGCS has a logic high level (e.g., about 2 V), a first transfer gate 151 and a second transfer gate 161 may generate transfer channels between the first bridging diffusion 150 and the first floating diffusion region 153 and between the second bridging diffusion 160 and the second floating diffusion region 163 in response to the third control signal TGCS. Through the transfer channels, the charges stored in the first bridging diffusion region 150 may be transferred to the first floating diffusion region 153, and the charges stored in the second bridging diffusion region 160 may be transferred to the second floating diffusion region 163.

After the charges are transferred and accumulated in the first floating diffusion region 153 and the second floating diffusion region 163, the first output unit 170 outputs a first data voltage to the first column line 177, and a second output unit 180 outputs a second data voltage to the second column line 187 (step S470).

The first drive transistor 173 may generate the first data voltage by amplifying a voltage corresponding to the charges accumulated in the first floating diffusion region 153, and a first select transistor 175 may output the first data voltage to the first column line 177 in response to a select signal SEL. A second drive transistor 183 may generate the second data voltage by amplifying a voltage corresponding to the charges accumulated in the second floating diffusion region 163, and a second select transistor 185 may output the second data voltage to the second column line 187 in response to the select signal SEL.

A photo detecting apparatus operated by the method according to an exemplary embodiment may generate image and/or depth information by performing correlated double sampling based on a voltage difference between a data voltage and a reset voltage, thereby reducing a noise and improving the quality of the image and/or the depth information.

Figure 32:
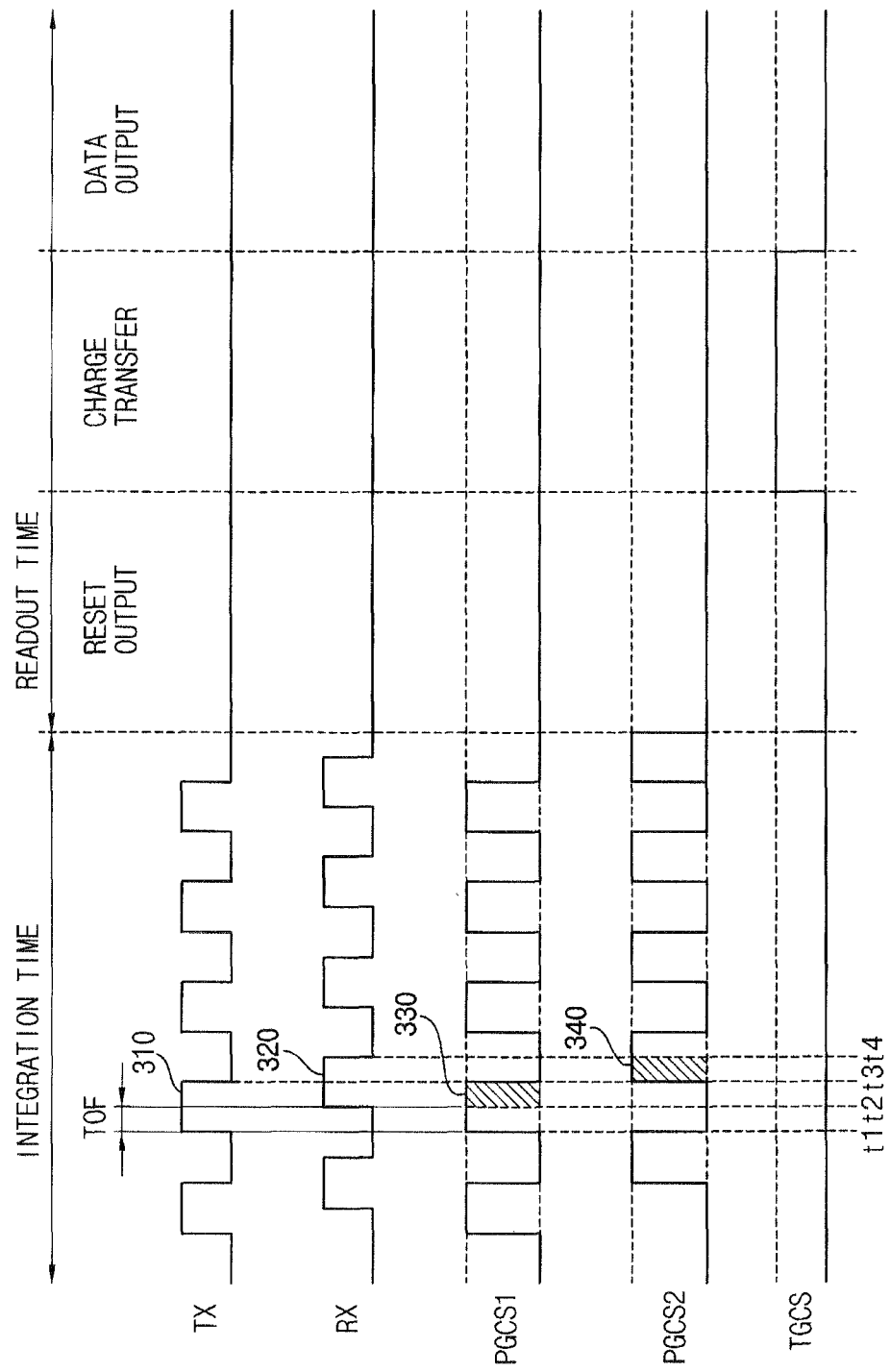
FIG. 32 is a timing diagram illustrating intensity of transmitted light, intensity of received light and control signals in a unit pixel operated by the method of FIG. 31.

FIG. 32 is a timing diagram illustrating intensity of transmitted light, intensity of received light and control signals in a unit pixel operated by the method of FIG. 31.

Referring to FIGS. 22 and 32, during an integration time, a photo detecting apparatus including the unit pixel 100e may transmit light TX having periodically varying intensity. Light RX received by the photo detecting apparatus may be delayed by a TOF with respect to the transmitted light TX.

During the integration time, the first control signal PGCS1 may have the same phase as the intensity of the transmitted light TX, and the second control signal PGCS2 may have a phase difference of about 180 degrees with respect to the intensity of the transmitted light TX. A third control signal TGCS may have a logic low level. A first half-pixel including a first photogate 130 and a second half-pixel including a second photogate 140 may periodically perform a charge collection operation. Collected charges may be stored in a first bridging diffusion region 150 and a second bridging diffusion region 160.

During a readout time, a first output unit 170 and a second output unit 180 may output a first reset voltage and a second reset voltage to a first column line 177 and a second column line 187, respectively. After the first reset voltage and the second reset voltage are outputted, the third control signal TGCS may have a logic high level. A first transfer gate 151 and a second transfer gate 161 may transfer the charged stored in the first bridging diffusion region 150 and the second bridging diffusion region 160 to a first floating diffusion region 153 and a second floating diffusion region 163 in response to the third control signal TGCS having the logic high level, respectively. After the charges are transferred and accumulated, the first output unit 170 and the second output unit 180 may output a first data voltage and a second data voltage to the first column line 177 and the second column line 187, respectively.

Figure 33A:
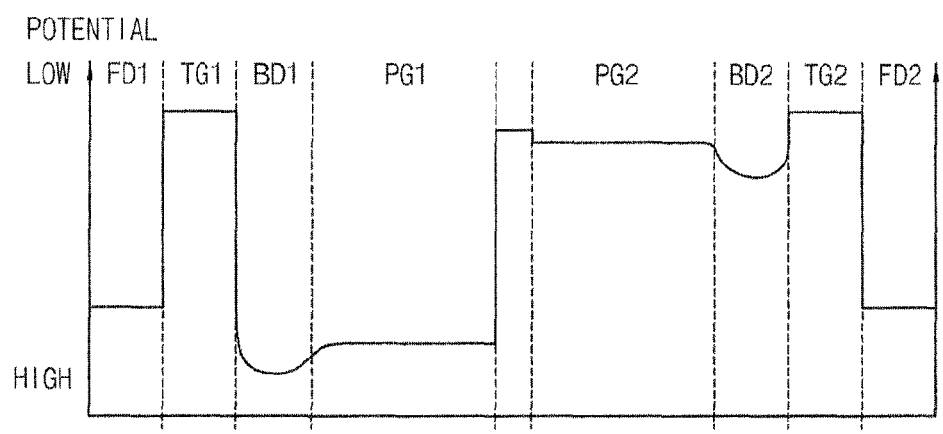
FIGS. 33A and 33B are diagrams illustrating potential levels of the unit pixel of FIG. 19 operated by the method of FIG. 31.
Figure 33B:
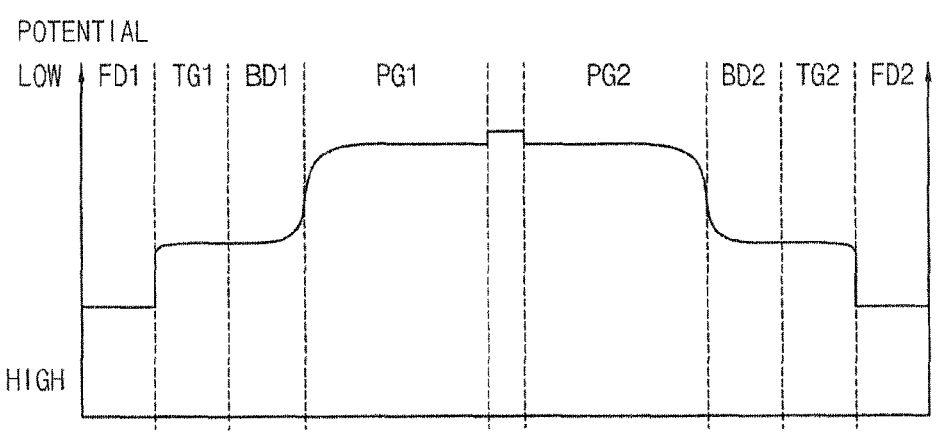

FIGS. 33A and 33B are diagrams illustrating potential levels of the unit pixel of FIG. 19 operated by the method of FIG. 31.

In FIG. 33A, potential levels of the unit pixel 100e of FIGS. 19 through 22 during a time period (e.g., t2 through t3) when a first control signal PGCS1 has a first logic level and a second control signal PGCS2 has a second logic level are illustrated.

Referring to FIGS. 19, 22 and 33A, when the first control signal PGCS1 has the first logic level, a first charge collection region 121 generated by a first photogate 130 may collect charges generated in a semiconductor substrate 110. Similarly, when the second control signal PGCS2 has the first logic level, a second charge collection region 122 generated by a second photogate 140 may collect the charges generated in a semiconductor substrate 110.

Substrate regions under a first transfer gate 151 and a second transfer gate 161 have voltage levels lower than those of the first charge collection region 121 and the second charge collection region 122. Accordingly, during the integration time, the charged collected in the first charge collection region 121 and the second charge collection region 122 may not be transferred to a first floating diffusion region 153 and a second floating diffusion region 163.

In FIG. 33B, potential levels of the unit pixel 100e of FIGS. 19 through 22 when charges are transferred during a readout time are illustrated.

Referring to FIGS. 19, 22 and 33B, when the charge transfer is performed, substrate regions under a first transfer gate 151 and a second transfer gate 161 have voltage levels higher than those of a first charge collection region 121 and a second charge collection region 122. Accordingly, charges stored in a first bridging diffusion region 150 may be transferred to a first floating diffusion region 153, and charges stored in a second bridging diffusion region 160 may be transferred to a second floating diffusion region 163.

Figure 34:
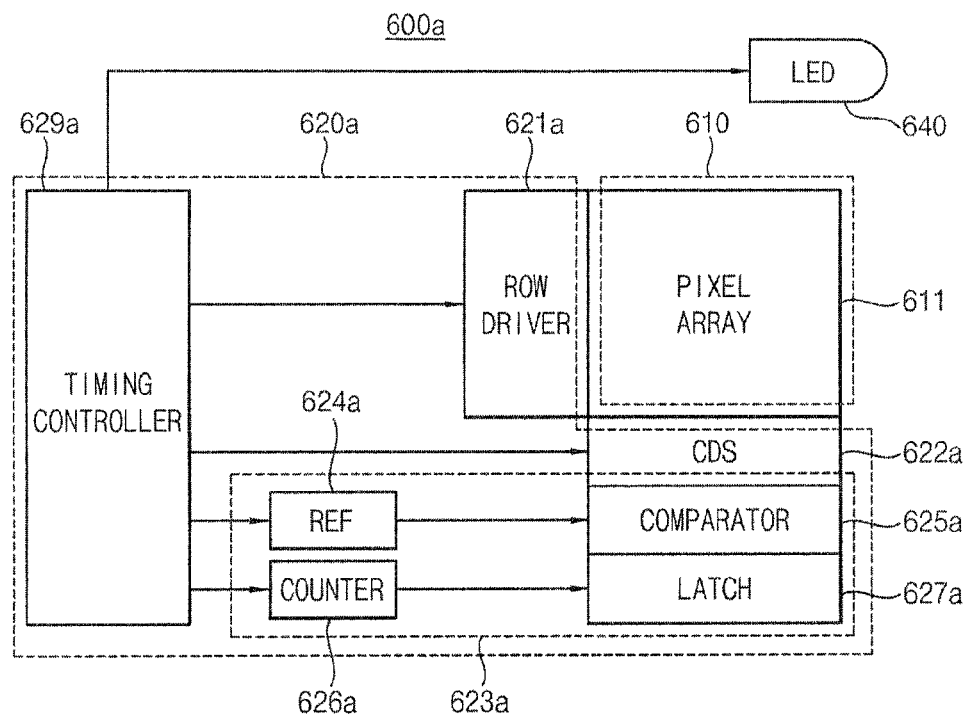
FIG. 34 is a block diagram illustrating a photo detecting apparatus according to an exemplary embodiment.

FIG. 34 is a block diagram illustrating a photo detecting apparatus according to an exemplary embodiment.

Referring to FIG. 34, a photo detecting apparatus 600a includes a photoelectric converting unit 610, a signal processing unit 620a and a light emitting device 640.

The photoelectric converting unit 610 generates electrical signals based on incident light. The photoelectric converting unit 610 may include a pixel array 611 where unit pixels are arranged in a matrix form.

The pixel array 611 may include a unit pixel 100, 100a, 100b, 100c, 100d, 100e, 100f, 100g, 100h according to an exemplary embodiment. Since the unit pixel 100, 100a, 100b, 100c, 100d, 100e, 100f, 100g, 100h generates depth information, or distance information of an object, the photo detecting apparatus 600a may be referred to as a depth sensor. The pixel array 611 may further include an image pixel for generating image information. In this case, since the image information as well as the depth information is generated, the photo detecting apparatus 600a may be referred to as a three-dimensional depth sensor. A ratio of the number of image pixels to the number of unit pixels 100, 100a, 100b, 100c, 100d, 100e, 100f, 100g, 100h may be varied. For example, the ratio of the number of image pixels to the number of unit pixels 100, 100a, 100b, 100c, 100d, 100e, 100f, 100g, 100h may be N:1, where N is a natural number.

The photoelectric converting unit 610 may further include an infrared filter and/or a color filter. For example, the infrared filter may be formed on the unit pixel 100, 100a, 100b, 100c, 100d, 100e, 100f, 100g, 100h, and the color filter may be formed on the image pixel. The photoelectric converting unit 610 may further include a micro lens for concentrating light.

The signal processing unit 620a may include a row driver 621a, a correlated double sampling (CDS) unit 622a, an analog-digital converting (ADC) unit 623a and a timing controller 629a.

The row driver 621a is connected with each row of the pixel array 611. The row driver 621a may generate driving signals to drive each row. For example, the row driver 621a may drive a plurality of unit pixels included in the pixel array 611 row by row.

The CDS unit 622a performs analog double sampling (ADS) by obtaining a difference between reset components and measured signal components using capacitors and switches, and outputs analog signals corresponding to effective signal components. The CDS unit 622a may include a plurality of CDS circuits that are connected to column lines, respectively. The CDS unit 622a may output the analog signals corresponding to the effective signal components column by column.

The ADC unit 623a may convert the analog signals corresponding to the effective signal components into digital signals. The ADC unit 623a may include a reference signal generator 624a, a comparison unit 625a, a counter 626a and a latch unit 627a. The reference signal generator 624a may generate a reference signal (e.g., a ramp signal having a slope), and provide the reference signal to the comparison unit 625a. The comparison unit 625a may output comparison signals having respective transition timings according to respective effective signal component column by column.

The counter 626a may perform a counting operation to generate a counting signal, and provide the counting signal to the latch unit 627a. The latch unit 627a may include a plurality of latch circuits respectively connected to the column lines. The latch unit 627a may latch the counting signal of each column line in response to the transition of each comparison signal, and output the latched counting signal as image and/or depth data.

The timing controller 629a may control operation timings of the row driver 621a, the CDS unit 622a, and the ADC unit 623a. The timing controller 629a may provide timing signals and control signals to the row driver 621a, the CDS unit 622a, and the ADC unit 623a.

The light emitting device 640 may emit light having a predetermined wavelength. For example, the light emitting device 640 may emit infrared light. The light emitting device 640 may include a light emitting diode (LED), a laser diode, or the like. The timing controller 629a may control operation timings of the light emitting device 640.

The light emitting device 640 may be periodically turned on by the timing controller 629a, and thus the light emitting device 640 may transmit light having periodically varying intensity.

Figure 35:
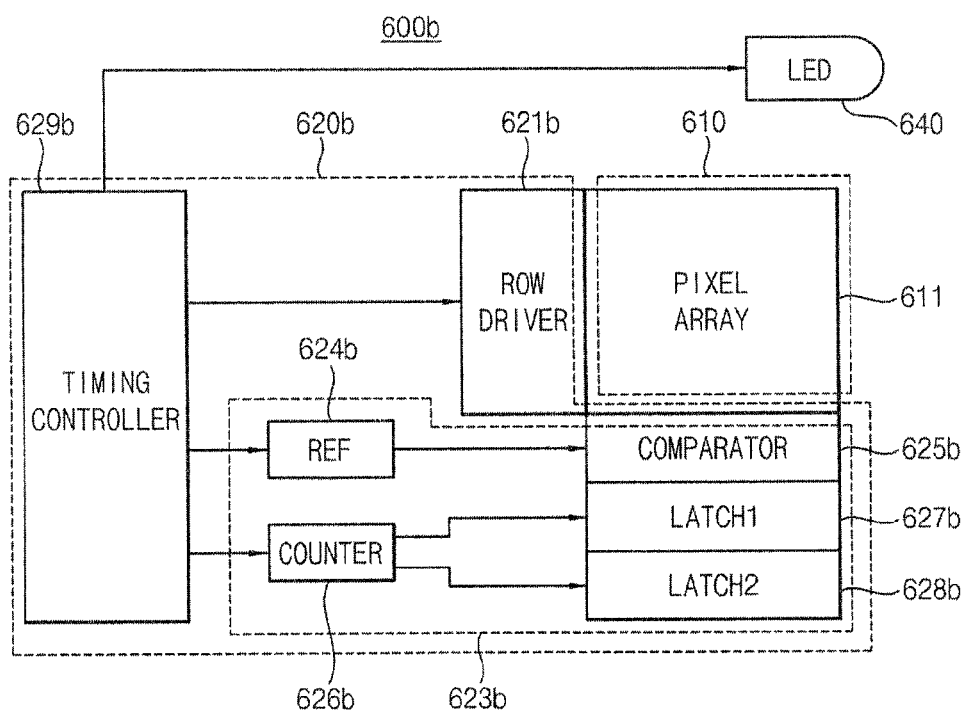
FIG. 35 is a block diagram illustrating a photo detecting apparatus according to an exemplary embodiment.

FIG. 35 is a block diagram illustrating a photo detecting apparatus according to an exemplary embodiment.

Referring to FIG. 35, a photo detecting apparatus 600b includes a photoelectric converting unit 610, a signal processing unit 620b and a light emitting device 640. The signal processing unit 620b includes a row driver 621b, an ADC unit 623b and a timing controller 629b. The ADC unit 623b includes a reference signal generator 624b, a comparison unit 625b, a counter 626b, a first latch unit 627b and a second latch unit 628b.

The photo detecting apparatus 600b performs digital double sampling (DDS) by converting analog signals corresponding to a reset component and a measured signal component into two digital signals and obtaining as an effective signal component the difference between the two digital signals.

A pixel array 611 may output a first analog signal indicating the reset component and a second analog signal indicating the measured signal component. In a first sampling, the comparison unit 625b may compare the first analog signal indicating the reset component with a reference signal from the reference signal generator 624b, and output a comparison signal having a transition time point corresponding to the reset component. Such operations may be performed with respect to each column. A counting signal from the counter 626b may be commonly provided to first latch circuits included in the first latch unit 627b. Each of the first latch circuits included in the first latch unit 627b may latch the counting signal at each transition time point of the corresponding comparison signal to store a first count value.

In a second sampling, the comparison unit 625b may compare the second analog signal indicating the measured image component with the reference signal from the reference signal generator 624b, and output a comparison signal having a transition time point corresponding to the measured signal component. A counting signal from the counter 626b may be commonly provided to second latch circuits included in the second latch unit 628b. Each of the second latch circuits included in the second latch unit 628b may latch the counting signal at each transition time point of the corresponding comparison signal to store a second count value. The first and second count values stored in the first and second latch units 627b, 628b are provided to internal logic circuits to calculate values corresponding to the effective signal components. As such, the DDS may be performed by the photo detecting apparatus 600b.

Figure 36:
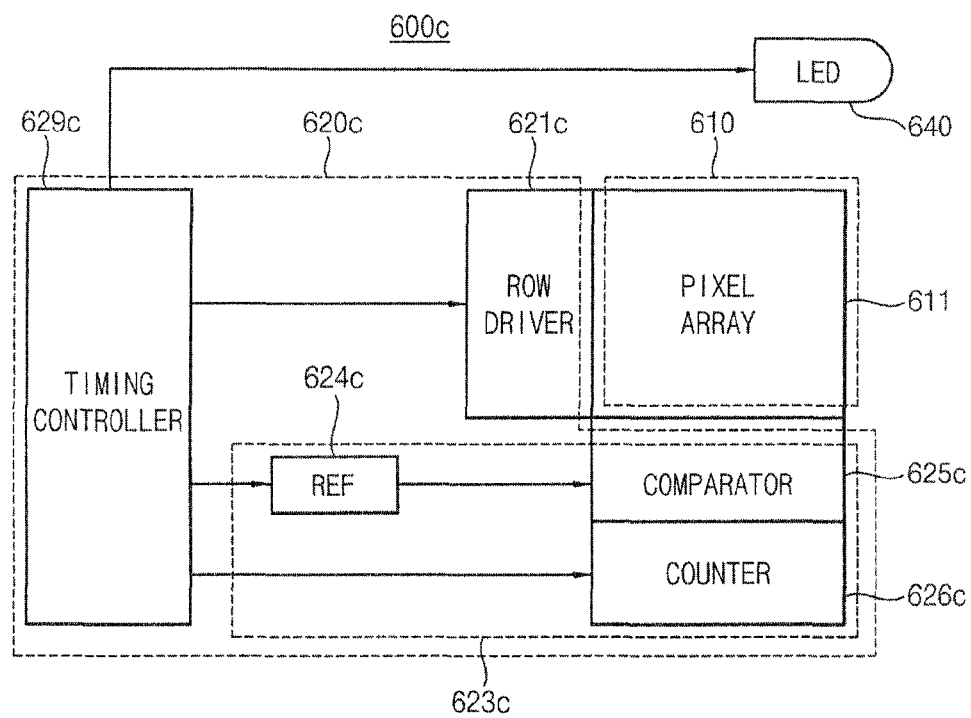
FIG. 36 is a block diagram illustrating a photo detecting apparatus according to an exemplary embodiment.

FIG. 36 is a block diagram illustrating a photo detecting apparatus according to an exemplary embodiment.

Referring to FIG. 36, a photo detecting apparatus 600c includes a photoelectric converting unit 610, a signal processing unit 620c and a light emitting device 640. The signal processing unit 620c includes a row driver 621c, an ADC unit 623c and a timing controller 629c. The ADC unit 623c includes a reference signal generator 624c, a comparison unit 625c, and a counter unit 626c.

Analog signals detected by a pixel array 611 are converted into digital signals by the ADC unit 623c including the comparison unit 625c and the counter unit 626c. The analog signals are output column by column, and thus the comparison unit 625c and the counter unit 626c may include a plurality of comparators and a plurality of counters according to the column number of the pixel array 611. Using the plurality of comparators and counters coupled to each column, the photo detecting apparatus 600c may simultaneously process a plurality of pixel signals corresponding to one row, thereby enhancing an operation speed and reducing noises.

The pixel array 611 may output sequentially a first analog signal and a second analog signal for CDS, where the first analog signal indicates a reset component and the second analog signal indicates a measured image component. Based on the first and second analog signals, the ADC unit 623c including the comparison unit 625c and the counter unit 626c performs CDS digitally, that is, performs DDS with respect to the respective columns.

While an exemplary embodiment of the photo detecting apparatus 600a performing ADS is illustrated in FIG. 34, and exemplary embodiments of the photo detecting apparatus 600b, 600c performing DDS are illustrated in FIGS. 35 and 36, a photo detecting apparatus according to an exemplary embodiment may perform dual correlated double sampling including the ADS and the DDS.

Figure 37:
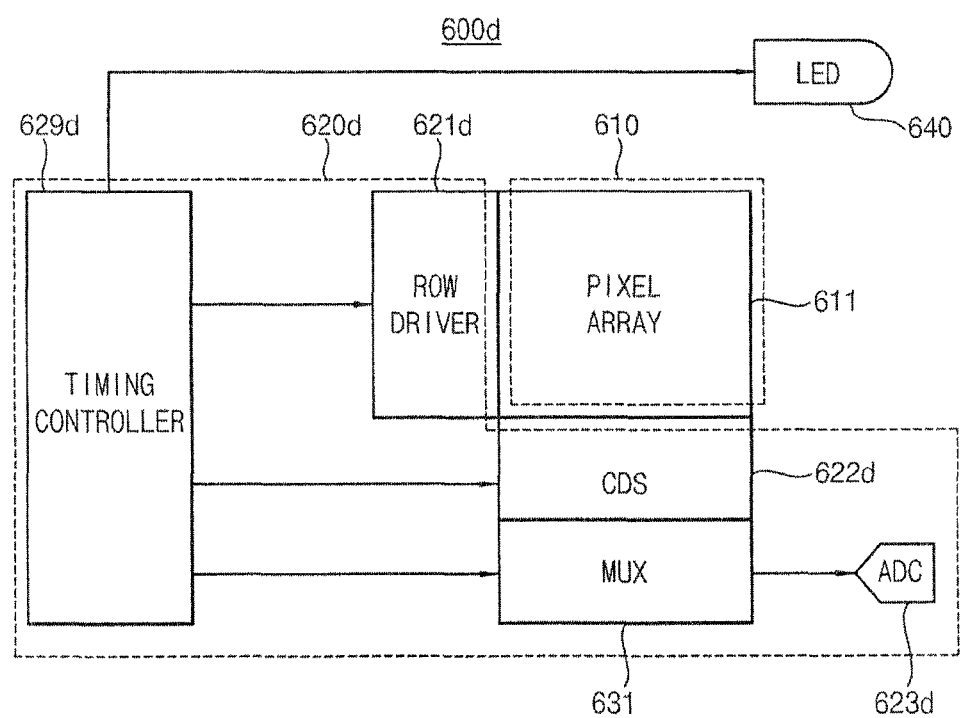
FIG. 37 is a block diagram illustrating a photo detecting apparatus according to an exemplary embodiment.

FIG. 37 is a block diagram illustrating a photo detecting apparatus according to an exemplary embodiment.

While exemplary embodiments of the photo detecting apparatus 600a, 600b, 600c performing ADC operations column by column are illustrated in FIGS. 34 through 36, a photo detecting apparatus 600d of FIG. 37 may utilize a single ADC 623d for converting an analog signal of each column into a digital signal one after another.

Referring to FIG. 37, the photo detecting apparatus 600d includes a photoelectric converting unit 610, a signal processing unit 620d and a light emitting device 640. The signal processing unit 620d includes a row driver 621d, a CDS unit 622d, a multiplexer 631, an ADC 623d and a timing controller 629d.

The CDS unit 622d may perform analog double sampling (ADS) by obtaining a difference between an analog reset signal corresponding to a reset component and an analog data signal corresponding to a measured signal component, and output an analog signal corresponding to an effective signal component column by column. The multiplexer 631 may output analog signals transmitted through column lines one after another. The ADC 623d may generate image and/or depth data by converting each analog signal into a digital signal.

The photo detecting apparatus 600d may include the single ADC 623d for converting signals through a plurality of column lines, thereby reducing a circuit size.

Figure 38:
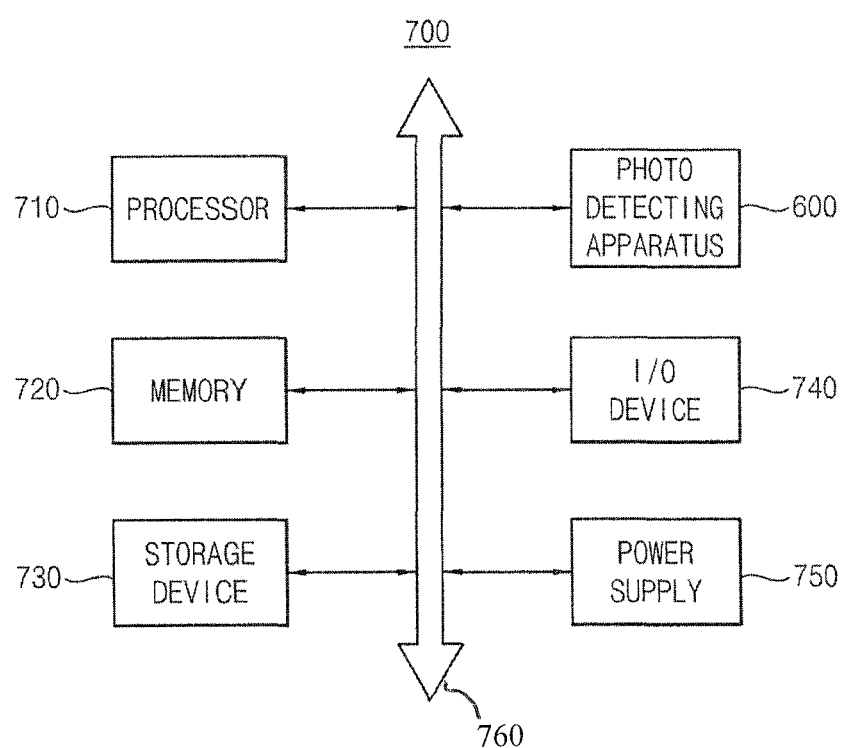
FIG. 38 is a block diagram illustrating a system including a photo detecting apparatus according to an exemplary embodiment.

FIG. 38 is a block diagram illustrating a system including a photo detecting apparatus according to an exemplary embodiment.

Referring to FIG. 38, a system 700 includes a photo detecting apparatus 600, a processor 710, a memory device 720, an input/output device 740, a storage device 730 and a power supply 750.

The processor 710 may perform various computing functions, such as executing specific software for performing specific calculations or tasks. For example, the processor 710 may be a microprocessor or a central process unit (CPU). The processor 710 may be coupled to the memory device 720 via an address bus, a control bus and/or a data bus. For example, the memory device 720 may be a dynamic random access memory (DRAM), a static random access memory (SRAM), or a non-volatile memory, such as an erasable programmable read-only memory (EPROM), an electrically erasable programmable read-only memory (EEPROM), or the like. The processor 710 may be coupled to an expansion bus, such as a peripheral-component-interconnect (PCI) bus. The processor 710 may control the input device 740 (e.g., a keyboard or a mouse), the output device 740 (e.g., a printer or a display device) and the storage device 730 (e.g., a solid state drive, a hard disk drive or a compact disk read-only memory (CD-ROM)). The processor 710 may communicate with the photo detecting apparatus 600 via a bus 760 or another communication link. The system 700 may further include a port for communicating with a device, such as a video card, a sound card, a memory card, a USB device, etc., or another system. The system 700 may further include the power supply 750 for supplying operation voltages.

In an exemplary embodiment, the photo detecting apparatus 600 may be integrated in a chip with the processor 710, such as a microprocessor, a CPU, a digital signal processor, etc., and the memory device 720 may be further integrated with the processor 710. In other embodiments, the photo detecting apparatus 600 and the processor 710 may be integrated in different chips.

When the photo detecting apparatus 600 is a three-dimensional depth sensor, an apparatus for detecting image information and an apparatus for detecting depth information are implemented in one chip or in two different chips.

The system 700 may be a computer, a digital camera, a three-dimensional camera, a mobile phone, a PDA, a scanner, a car navigator, a video phone, a monitoring system, an auto-focusing system, a tracking system, a motion detecting system, an image stabilization system, or any system including a photo detecting apparatus.

As described above, the exemplary embodiments of the unit pixel and the photo detecting apparatus can improve charge transfer efficiency. Further, exemplary embodiments of the unit pixel and the photo detecting apparatus can improve the quality of the image and/or the depth information.

Although practical exemplary embodiments have been described, those skilled in the art will readily appreciate that modifications can be made without materially departing from the present inventive concept. Accordingly, the disclosed exemplary embodiments, all such modifications to the exemplary embodiments, as well as other exemplary embodiments, are intended to be included within the scope of the appended claims.

What is claimed is:

1. A unit pixel of a photo detecting apparatus, the unit pixel comprising: a first photogate including:
   a first gate extending in a first direction, and a plurality of second gates extending from the first gate in a second direction substantially perpendicular to the first direction;
   a first transfer gate located adjacent the first gate;
   a first floating diffusion region located adjacent the first transfer gate, wherein the first transfer gate is located between the first floating diffusion region and the first gate;
   a second photogate separated from the first photogate, the second photogate including:
      a third gate extending in the first direction, and a plurality of fourth gates extending from the third gate in the second direction, the first photogate and the second photogate disposed substantially symmetrically with each other;
   a second transfer gate located adjacent the third gate; and
   a second floating diffusion region located adjacent the second transfer gate.

2. The unit pixel of claim 1, wherein the first gate provides a path through which charges collected under the second gates are transferred to the first floating diffusion region.

3. The unit pixel of claim 1, further comprising a channel stop region located between the first photogate and the second photogate.

4. The unit pixel of claim 3, wherein the channel stop region is a charge barrier between a region under the first photogate and a region under the second photogate.

5. The unit pixel of claim 3, wherein the channel stop region is configured to prevent charges collected under the first photogate from being transferred to a region under the second photogate, and to prevent charges collected under the second photogate from being transferred to a region under the first photogate.

6. The unit pixel of claim 1, further comprising a bridging diffusion region located between the first gate and the first transfer gate.

7. The unit pixel of claim 6, wherein the bridging diffusion region is configured to attract charges collected by the first photogate.

8. The unit pixel of claim 1, wherein the first photogate comprises a transparent conducting oxide.

9. The unit pixel of claim 8, wherein the transparent conducting oxide is selected from the group consisting of indium tin oxide, indium zinc oxide, zinc oxide, and titanium dioxide.

10. The unit pixel of claim 1, wherein the first photogate is located over a semiconductor substrate, and wherein the semiconductor substrate includes an epitaxial layer having a doping density that gradually decreases in a direction toward a surface of the semiconductor substrate proximal to the first photogate.

11. The unit pixel of claim 10, wherein the epitaxial layer includes a buried channel.

12. The photo detecting apparatus comprising the unit pixel of claim 1, wherein the apparatus applies a first control signal to the first photogate, and wherein the first control signal periodically transitions between a first logic level and a second logic level during an integration time.

13. The apparatus of claim 12, wherein charges generated by incident light are collected under the first photogate while the first control signal has the first logic level, and wherein the charges collected under the first photogate are transferred to the first floating diffusion region while the first control signal has the second logic level.

14. The photo detecting apparatus comprising the unit pixel of claim 1, wherein the apparatus applies a control signal having a predetermined level to the first transfer gate, and wherein the first transfer gate is half turned on in response to the control signal.

15. The apparatus of claim 14, wherein the first transfer gate is configured to prevent charges collected under the first photogate from being transferred to the first floating diffusion region while the first control signal has the first logic level, and wherein the first transfer gate is configured to transfer the charges collected under the first photogate to the first floating diffusion region while the first control signal has the second logic level.

16. The unit pixel of claim 1, wherein the first transfer gate is distinct and separate from the first gate.

17. A photo detecting device, comprising:
a photoelectric converting unit including a plurality of unit pixels for converting incident light into electrical signals, each of the unit pixels comprising:
a first photogate including:
a first gate extending in a first direction, and a plurality of second gates extending from the first gate in a second direction substantially perpendicular to the first direction;
a first transfer gate located adjacent the first gate;
a first floating diffusion region located adjacent the first transfer gate, wherein the first transfer gate is located between the first floating diffusion region and the first gate;
a second photogate separated from the first photogate, the second photogate including:
a third gate extending in the first direction, and a plurality of fourth gates extending from the third gate in the second direction, the first photogate and the second photogate disposed substantially symmetrically with each other;
a second transfer gate located adjacent the third gate; and
a second floating diffusion region located adjacent the second transfer gate; and
a signal processing unit configured to generate data by processing the electrical signals,
wherein the signal processing unit applies a control signal to the transfer gate to half turn on the transfer gate during an integration time.

18. The photo detecting device of claim 17, wherein the plurality of unit pixels form a pixel array having rows and columns, and wherein the signal processing unit comprises:
a row driver connected with each row of the pixel array;
a correlated double sampling unit connected with each column of the pixel array; and
a timing controller that provides timing signals to control operational timing of the row driver and the correlated double sampling unit.

19. The photo detecting device of claim 18, wherein the photo detecting device further comprises an analog-digital converting unit configured to convert the analog signals to digital signals; and wherein the correlated double sampling unit is configured to perform analog double sampling to obtain a difference between reset components of a unit pixel and measured signal components of a unit pixel and output the analog signals to the analog-digital converting unit.

20. The photo detecting device of claim 17, wherein the signal processing unit is configured to communicate with a processor over a bus and to allow the processor to receive and process the data.

21. The photo detecting device of claim 20, wherein the processor interacts with a memory, a storage device, an input/output device and a power supply connected to the bus.

22. The photo detecting device of claim 17, wherein during the integration time, the photo detecting device adds data from half of one of the unit pixels to data from a remaining half of the one unit pixel.

23. The photo detecting device of claim 17, wherein one of the unit pixels comprises a bridging diffusion region located between the first gate and the first transfer gate, wherein the photo detecting device sets the control signal to a first level during the integration time, sets the control signal to a second level during a readout time after the integration time, and sets the control signal to a third level to transfer a charge between the bridging diffusion region and the first floating diffusion region, and wherein the first level is in between the second and third levels.

24. The photo detecting device of claim 17, wherein the first transfer gate is distinct and separate from the first gate.

* * * * *